(12) United States Patent
Pan

(10) Patent No.: US 8,313,963 B2
(45) Date of Patent: Nov. 20, 2012

(54) LIGHT EMITTING DEVICE

(75) Inventor: Shaoher X. Pan, San Jose, CA (US)

(73) Assignee: SiPhoton Inc., San Jose, CA (US)

( * ) Notice: Subject to any disclaimer, the term of this patent is extended or adjusted under 35 U.S.C. 154(b) by 50 days.

(21) Appl. No.: 12/767,577

(22) Filed: Apr. 26, 2010

(65) Prior Publication Data

US 2010/0203662 A1     Aug. 12, 2010

Related U.S. Application Data

(60) Division of application No. 12/177,114, filed on Jul. 21, 2008, now abandoned, which is a continuation-in-part of application No. 11/761,446, filed on Jun. 12, 2007, now Pat. No. 7,956,370.

(51) Int. Cl.
*H01L 21/00* (2006.01)
(52) U.S. Cl. .......................... 438/29; 438/47
(58) Field of Classification Search .................. 257/13, 257/14, 94, 95, 103, E33.003, E33.005, E33.006, 257/E33.007, E33.008, E33.023, E33.025; 438/22, 29, 46, 47
See application file for complete search history.

(56) References Cited

U.S. PATENT DOCUMENTS

| | | | |
|---|---|---|---|
| 5,793,062 A * | 8/1998 | Kish et al. ..................... | 257/98 |
| 5,838,029 A | 11/1998 | Shakuda et al. | |
| 5,854,088 A | 12/1998 | Plais et al. | |
| 5,905,275 A | 5/1999 | Nunoue et al. | |
| 6,233,265 B1 | 5/2001 | Bour et al. | |
| 6,345,063 B1 | 2/2002 | Bour et al. | |
| 6,426,512 B1 | 7/2002 | Ito et al. | |
| 6,635,901 B2 | 10/2003 | Sawaki et al. | |
| 6,657,237 B2 | 12/2003 | Kwak et al. | |
| 6,844,569 B1 | 1/2005 | Lee et al. | |
| 6,881,981 B2 | 4/2005 | Tsuda et al. | |
| 6,936,851 B2 | 8/2005 | Wang | |
| 6,949,395 B2 | 9/2005 | Yoo | |
| 7,063,995 B2 | 6/2006 | Hata et al. | |
| 7,087,934 B2 | 8/2006 | Oohata et al. | |
| 7,176,480 B2 | 2/2007 | Ohtsuka et al. | |
| 7,453,093 B2 | 11/2008 | Kim et al. | |
| 7,550,775 B2 | 6/2009 | Okuyama | |
| 7,816,156 B2 | 10/2010 | Choi et al. | |
| 7,956,370 B2 | 6/2011 | Pan | |
| 7,968,356 B2 | 6/2011 | Kim | |
| 7,982,205 B2 | 7/2011 | Wang | |
| 8,129,205 B2 | 3/2012 | Rana et al. | |

(Continued)

FOREIGN PATENT DOCUMENTS

CN    1638162 A    7/2005

(Continued)

OTHER PUBLICATIONS

Non-Final Office Action Mailed May 14, 2010 in Co-Pending U.S. Appl. No. 11/761,446, filed Jun. 12, 2007.
Authorized officer Julio Maldonado, International Search Report and Written Opinion in PCT/US2011/20603, mailed Dec. 6, 2011, 11 pages.

(Continued)

*Primary Examiner* — Hung Vu
(74) *Attorney, Agent, or Firm* — Fish & Richardson P.C.

(57) ABSTRACT

A light emitting device includes a substrate having a first surface and a second surface not parallel to the first surface, and a light emission layer disposed over the second surface to emit light. The light emission layer has a light emission surface which is not parallel to the first surface.

14 Claims, 33 Drawing Sheets

U.S. PATENT DOCUMENTS

| | | | |
|---|---|---|---|
| 8,138,511 B2 | 3/2012 | Baur et al. | |
| 8,148,744 B2 | 4/2012 | Niki et al. | |
| 8,217,418 B1 | 7/2012 | Pan et al. | |
| 2001/0022495 A1 | 9/2001 | Salam | |
| 2004/0113166 A1 | 6/2004 | Tadatomo et al. | |
| 2005/0145862 A1* | 7/2005 | Kim et al. | 257/91 |
| 2005/0179025 A1 | 8/2005 | Okuyama et al. | |
| 2005/0179130 A1 | 8/2005 | Tanaka et al. | |
| 2005/0199891 A1 | 9/2005 | Kunisato et al. | |
| 2006/0169987 A1* | 8/2006 | Miura et al. | 257/79 |
| 2007/0200135 A1 | 8/2007 | Wang | |
| 2008/0032409 A1 | 2/2008 | Lee et al. | |
| 2008/0179611 A1 | 7/2008 | Chitnis et al. | |
| 2008/0251808 A1 | 10/2008 | Kususe et al. | |
| 2008/0303042 A1 | 12/2008 | Minato et al. | |
| 2008/0308835 A1 | 12/2008 | Pan | |
| 2009/0026490 A1 | 1/2009 | Kim et al. | |
| 2009/0032799 A1 | 2/2009 | Pan | |
| 2009/0159869 A1 | 6/2009 | Ponce et al. | |
| 2009/0159870 A1 | 6/2009 | Lin et al. | |
| 2009/0298212 A1 | 12/2009 | Pan | |
| 2010/0078670 A1 | 4/2010 | Kim et al. | |
| 2010/0308300 A1 | 12/2010 | Pan | |
| 2011/0024722 A1 | 2/2011 | Moustakas et al. | |
| 2011/0108800 A1 | 5/2011 | Pan | |
| 2011/0114917 A1 | 5/2011 | Pan | |
| 2011/0175055 A1 | 7/2011 | Pan | |
| 2011/0177636 A1 | 7/2011 | Pan et al. | |
| 2011/0233581 A1 | 9/2011 | Sills et al. | |
| 2012/0043525 A1 | 2/2012 | Pan | |
| 2012/0205617 A1 | 8/2012 | Pan | |

FOREIGN PATENT DOCUMENTS

| | | |
|---|---|---|
| JP | 2006-045648 | 2/1994 |
| JP | 2002-261327 A | 9/2002 |
| JP | 2005-064204 A | 3/2005 |
| JP | 2005328073 A | 11/2005 |
| KR | 20030074824 A | 4/2005 |
| KR | 100649769 B1 | 11/2006 |
| KR | 100705226 B1 | 4/2007 |

OTHER PUBLICATIONS

Authorized officer Nora Lindner, International Preliminary Report on Patentability in PCT/US2010/035020, mailed Dec. 22, 2011, 10 pages.
International Search Report PCT/US2008/008868 dated Apr. 15, 2009, pp. 1-4.
Written Opinion PCT/US2008/008868 dated Apr. 15, 2009, pp. 1-6.
International Search Report PCT/US2008/068067 dated Feb. 26, 2010, pp. 1-3.
Written Opinion PCT/US2008/068067 dated Feb. 26, 2010, pp. 1-5.
Co-pending U.S. Appl. No. 11/761,446, filed Jun. 12, 2007.
Co-pending U.S. Appl. No. 12/177,114, filed Jul. 21, 2008.
Co-pending U.S. Appl. No. 12/537,102, filed Aug. 6, 2009.
Co-pending U.S. Appl. No. 12/480,463, filed Jun. 8, 2009.
Fish & Richardson, Response to Non-Final Office Action in U.S. Appl. No. 11/761,446, mailed Aug. 16, 2010, 40 pages.
USPTO, Final Office Action in U.S. Appl. No. 11/761,446, mailed Oct. 29, 2010, 21 pages.
Fish & Richardson, Response to Final Office Action in U.S. Appl. No. 11/761,446, mailed Jan. 7, 2011, 9 pages.
USPTO, Non-Final Office Action in U.S. Appl. No. 12/537,102, mailed Dec. 15, 2010, 17 pages.
Fish & Richardson, Response to Non-Final Office Action in U.S. Appl. No. 12/537,102, mailed Jan. 14, 2011, 7 pages.
Authorized officer Young Bae Lee, International Search Report and Written Opinion in PCT/US2010/035020, mailed Dec. 17, 2010, 14 pages.
Authorized officer Simin Baharlou, International Preliminary Report on Patentability in PCT/US2008/068067, mailed Jan. 13, 2011, 7 pages.
Authorized officer Simin Baharlou, International Preliminary Report on Patentability in PCT/US2008/008868, mailed Feb. 3, 2011, 8 pages.
Authorized officer Hye Lyun Park, International Search Report and Written Opinion in PCT/US2012/024361, mailed Jun. 27, 2012, 8 pages.
Authorized officer Simin Baharlou, International Preliminary Report on Patentability in PCT/US2011/020603, mailed Aug. 2, 2012, 10 pages.

* cited by examiner

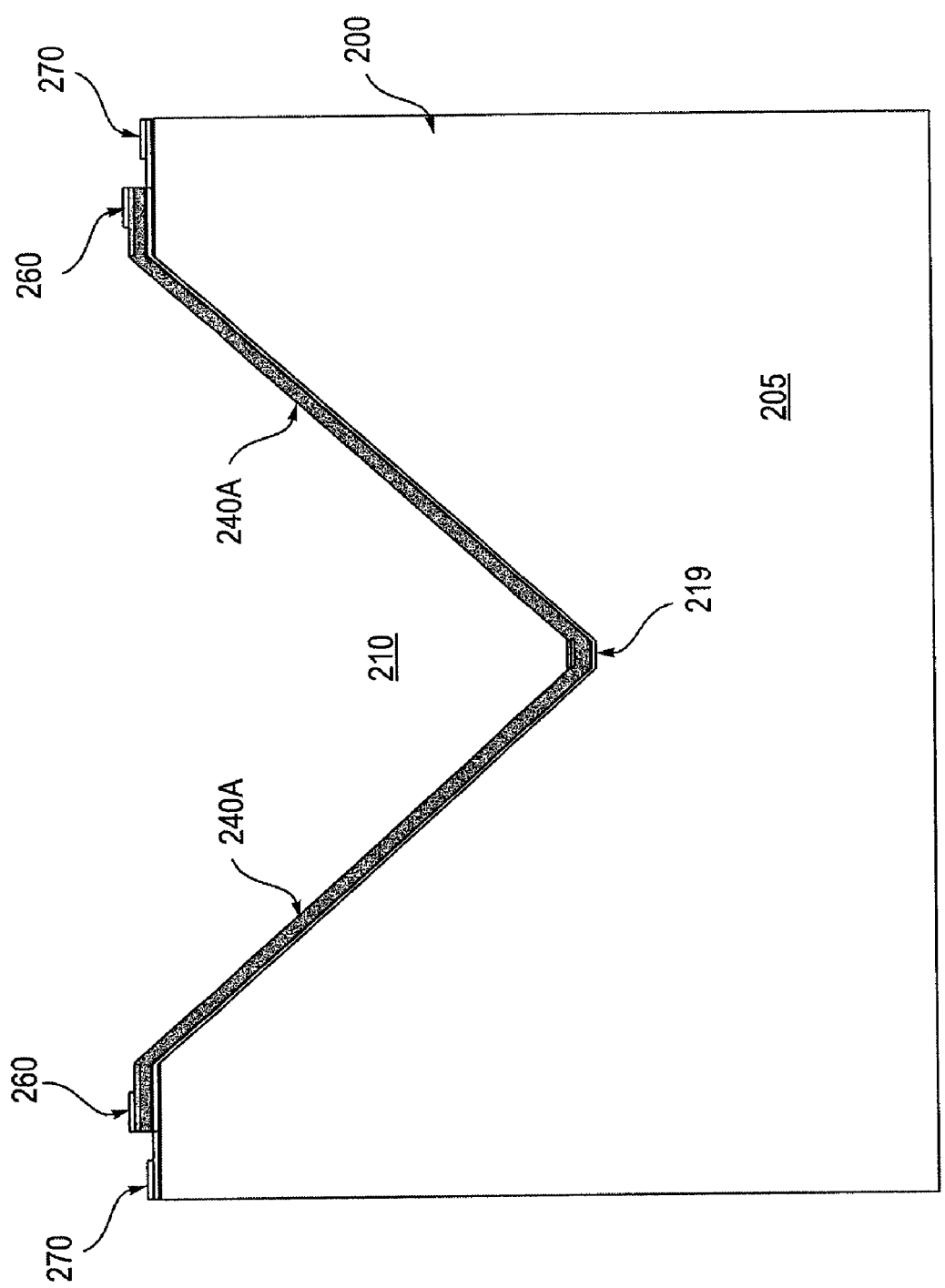

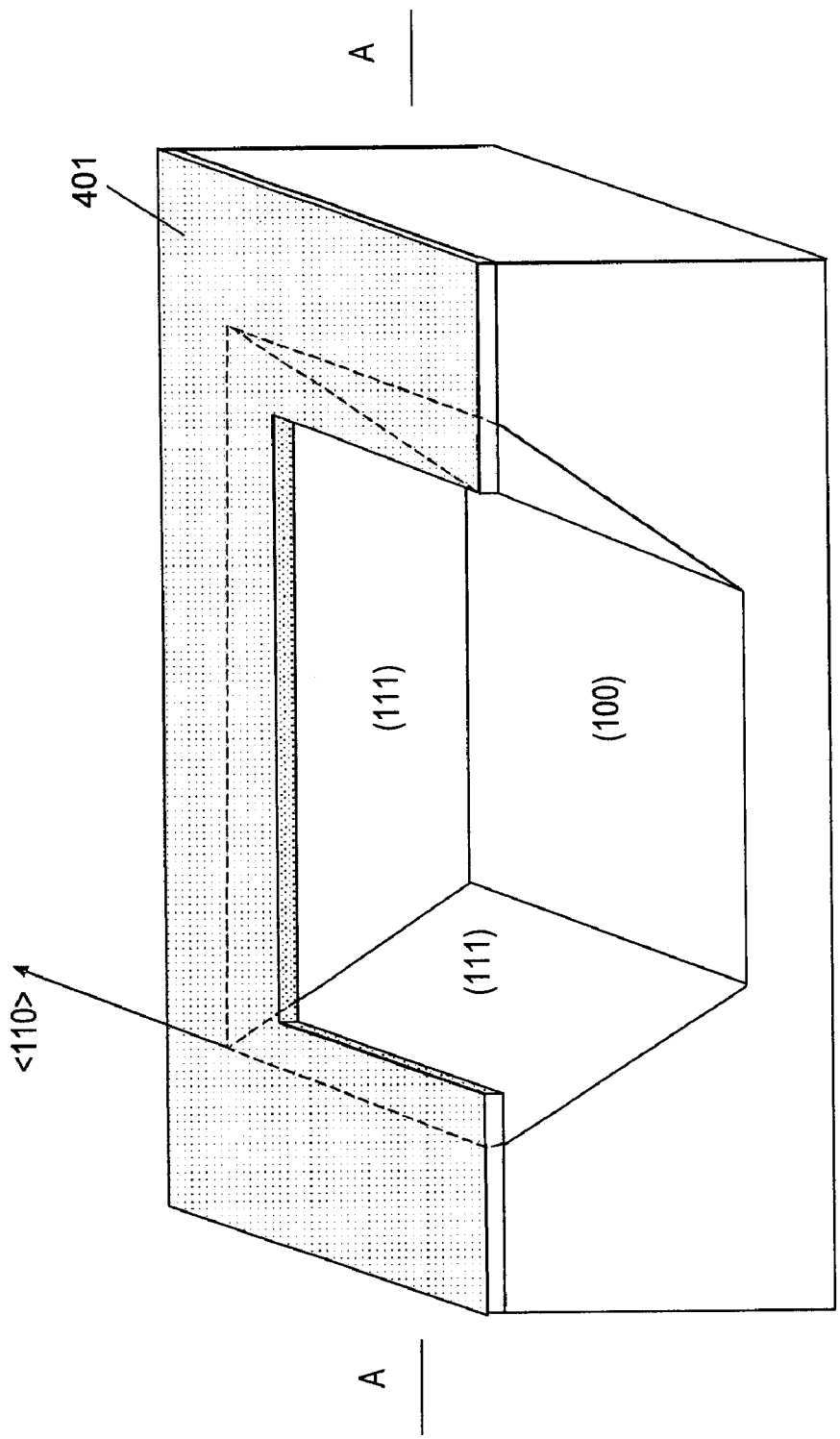
Figure 5B1

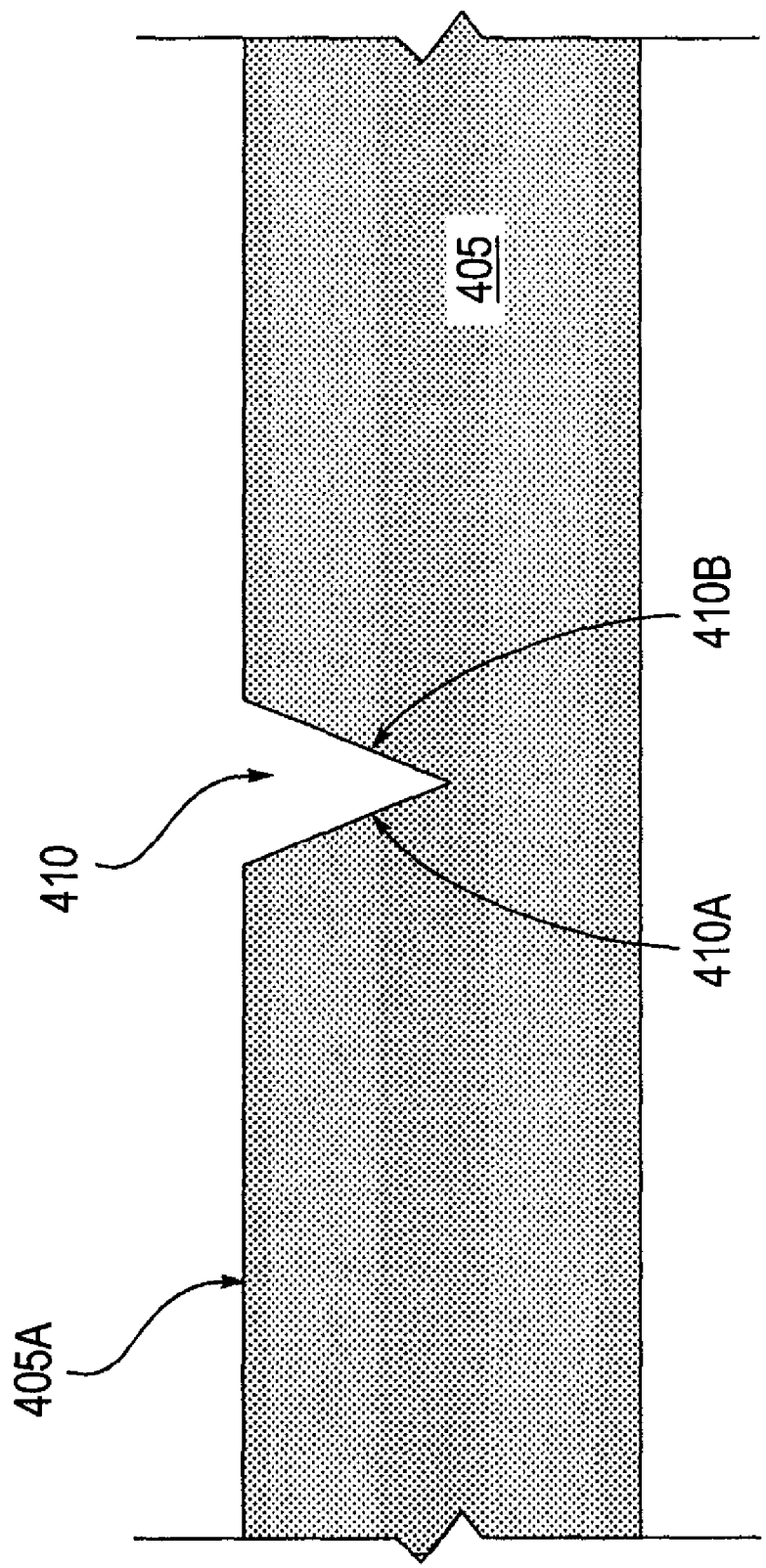
Figure 5B2

LIGHT EMITTING DEVICE

This application is a divisional of U.S. patent application Ser. No. 12/177,114 of S. Pan, filed on Jul. 21, 2008, which is a continuation-in-part of U.S. patent application Ser. No. 11/761,446 of S. Pan, filed on Jun. 12, 2007, both of which are incorporated herein by reference.

BACKGROUND

The present patent application is related to light emitting devices.

Solid-state light sources, such as light emitting diodes (LEDs) and laser diodes, can offer significant advantages over other forms of lighting, such as incandescent or fluorescent lighting. For example, when LEDs or laser diodes are placed in arrays of red, green and blue elements, they can act as a source for white light or as a multi-colored display. In such configurations, solid-state light sources are generally more efficient and produce less heat than traditional incandescent or fluorescent lights. Although solid-state lighting offers certain advantages, conventional semiconductor structures and devices used for solid-state lighting are relatively expensive. One of the costs related to conventional solid-state light emitting devices is related to the relatively low manufacturing throughput of the conventional solid-state light emitting devices.

Referring to FIG. 1, a conventional LED structure 100 includes a substrate 105, which may, for example, be formed of sapphire, silicon carbide, or spinel. A buffer layer 110 is formed on the substrate 105. The buffer layer 110 serves primarily as a wetting layer, to promote smooth, uniform coverage of the sapphire substrate. The buffer layer 110 is typically formed of GaN, InGaN, AlN, or AlGaN and has a thickness of about 100-500 Angstroms. The buffer layer 310 is typically deposited as a thin amorphous layer using Metal Organic Chemical Vapor Deposition (MOCVD).

A p-doped Group III-V compound layer 120 is formed on the buffer layer 110. The p-doped Group III-V compound layer 120 is typically made of GaN. An InGaN quantum-well layer 130 is formed on the p-doped Group III-V compound layer 120. An active Group III-V compound layer 140 is then formed on the InGaN quantum-well layer 130. An n-doped Group III-V compound layer 150 is formed on the layer 140. The p-doped Group III-V compound layer 120 is n-type doped. A p-electrode 160 is formed on the n-doped Group III-V compound layer 150. An n-electrode 170 is formed on the first Group III-V compound layer 120.

A drawback of the conventional LED structure 100 is the low manufacturing throughput associated with the small substrate dimensions. For example, sapphire or silicon carbide substrates are typically supplied in diameters of 2 to 4 inches. Another drawback of the conventional LED structure 100 is that its layered structure often suffers from cracking. Suitable substrates such as sapphire or silicon carbide are typically not available in single crystalline forms. The p-doped Group III-V compound layer 120 can suffer from cracking or delamination due to differential thermal expansions and lattice mismatching between the p-doped Group III-V compound layer and the substrate even in the presence of the buffer layer 110. The differential thermal expansions and lattice mismatching can also produce a bowing deformation (i.e., curling up) in the LED structure. As a result, light emitting performance of the LED structure 100 can be compromised.

Accordingly, there is therefore a need for a light emitting device that can overcome some or all of the drawbacks in the conventional light emitting systems.

SUMMARY OF THE INVENTION

In one aspect, the present invention relates to a light emitting device that includes a substrate having a first surface and a second surface not parallel to the first surface; and a light emission layer disposed over the second surface to emit light, the light emission layer having a light emission surface which is not parallel to the first surface.

In another aspect, the present invention relates to a light emitting device that includes a substrate; and a light emission layer disposed over the substrate to emit light, the light emission layer having a footprint area and having a light emission surface area which is greater than the footprint area.

In another aspect, the present invention relates to a light emitting device that includes a substrate having a first surface; a light emission layer disposed over at least a portion of the substrate, the light emission layer having a light emission surface that is not parallel to the first surface; and a reflective buffer layer disposed over at least a portion of the light emission layer, to reflect light emitted from the light emission layer, and wherein the reflective buffer layer has a reflectance coefficient higher than 30% in a spectral range of light emitted by the light emission layer.

In another aspect, the present invention relates to a light emitting device that includes a substrate having a first surface and a trench formed in the first surface; and a light emission layer disposed within the trench to emit light, the light emission layer having a light emission surface which is not parallel to the first surface, wherein the first surface outside of the trench can include at least one width dimension narrower than 1000 microns.

In another aspect, the present invention relates to a light emitting device that includes a substrate having a first surface and a protrusion formed on the first surface; and a light emission layer disposed on the protrusion to emit light, the light emission layer having a light emission surface which is not parallel to the first surface.

In another aspect, the present invention relates to a light emitting device that includes a substrate having a first surface; a trench formed in the substrate, wherein the trench is defined in part by a plurality of first trench surfaces that are not parallel to the first surface; a reflective buffer layer on at least a portion of the first surface and the plurality of first trench surfaces; and a light emitting layer over the reflective buffer layer, wherein the light emitting layer can emit light away from the reflective buffer layer, wherein the light emitted is confined in an angular range narrower than 150 degrees.

In another aspect, the present invention relates to a method for fabricating a light emitting device. The method includes forming a light emission layer over a substrate having a first surface and a second surface not parallel to the first surface, wherein the light emission layer has a light emission surface not parallel to the first surface, wherein the light emission layer can emit light.

Implementations of the system may include one or more of the following. The light emission layer can include a quantum-well layer that can emit light when an electric current is produced in the quantum-well layer. The quantum-well layer can include a layer formed by a material selected from the group consisting of InN, InGaN, GaN, AlGaN, and InGaAlN. The light emitting device can further include a buffer layer between the substrate and the light emission layer. The buffer layer can have a reflectance coefficient higher than 30% in the spectral range of the light emitted by the light emission layer. The buffer layer can have a reflectance coefficient higher than 50% in the spectral range of the light emitted by the light emission layer. The buffer layer can have a thickness in the range of 200 to 200,000 Angstroms. The buffer layer can include aluminum, aluminum nitride, an aluminum alloy, or Ag and its alloy, as reflective buffer layer. The buffer layer can include a material selected from the group consisting of GaN, ZnO, AlN, HfN, AlAs, SiCN, TaN, and SiC. The light emitting device can further include a lower Group III-V compound layer between the substrate and the light emission layer and an upper Group III-V compound layer over the light emission layer. The substrate can have a trench formed in the first surface, and wherein the light emission layer is disposed within the trench. The first surface outside of the trench can include at least one width dimension narrower than 1000 microns. The substrate can have a protrusion formed on the first surface, and wherein the light emission layer is disposed on the protrusion. The first surface outside of the protrusion can include at least one width dimension narrower than 1000 microns. The substrate can include silicon, silicon oxide, gallium nitride, silicon carbide, or sapphire. The substrate can include a silicon-on-insulator (SOI) structure, or simply a silicon bonded on glass to form a stop layer for interconnect electrodes.

An advantage associated with the disclosed light emitting device is that it significantly increases light emission intensity comparing to conventional LED light emitting devices. The disclosed light emitting devices and methods provide much larger light emitting surface than conventional LED light emitting devices having the same substrate foot print. A reflective layer under the disclosed light emitting devices can decrease absorption-related light loss and further increase emission efficiency. A transparent conductive layer formed on the upper Group III-V compound layer of the disclosed light emitting device can increase electric contact between the upper electrode and the upper III-V layer, and at the same time, maximize light emission intensity from the disclosed light emitting device.

Another advantage associated with the disclosed light emitting device is that its light emission is focused in much narrower angular range than conventional LED light emitting devices. The more concentrated angular light emission in the disclosed light emitting device reduces the light loss to unwanted directions and can thus increase brightness in the intended illumination directions and reduce energy consumption.

Another advantage associated with the disclosed light emitting device is that it is more practical to manufacture, robust, and reliable than some conventional light emitting systems. The disclosed light emitting devices and fabrication processes can overcome differential thermal expansions and lattice mismatch between the lower group compound III-V layer and the substrate and prevent associated layer cracking and delamination, problems known in conventional LED lighting systems.

The disclosed light emitting device and fabrication processes allow for high-throughput and high-volume manufacturing of the light emitting devices. A large number of solid state LEDs can be fabricated on a large substrate such as a silicon wafer or a glass substrate. Manufacturing throughput can be much improved since silicon wafer can be provided in much larger dimensions (e.g., 6 to 12 inch silicon wafers) compared to the small substrates used in the conventional light emitting devices. The disclosed light emitting device can be fabricated using commercially available semiconductor processing equipment such as ALD and MOCVD systems without using customized fabrication equipments, which makes the disclosed manufacturing process easily implemented. The disclosed light emitting device can thus be fabricated more efficiently in cost and time than some conventional light emitting devices that need.

Furthermore, the disclosed light emitting devices can be made more integrated, compact, and cost effective compared to some conventional LED devices. The disclosed light emitting devices can be fabricated on a silicon-based substrate which allows the integration of electronic control circuitry in the substrate.

BRIEF DESCRIPTION OF THE DRAWINGS

The following drawings, which are incorporated in and from a part of the specification, illustrate embodiments of the present invention and, together with the description, serve to explain the principles of the invention.

FIG. 3A is a cross-sectional view of the light emitting device along line A-A in FIG. 2A.

FIG. 5B1 is a perspective view of the light emitting device in FIG. 5A after etching through the mask shown in FIG. 5A.

FIGS. 5B2 and 5C-5I are cross-sectional views at different steps of forming the light emitting device of FIG. 4B.

DESCRIPTION OF THE INVENTION

Figure 3B:
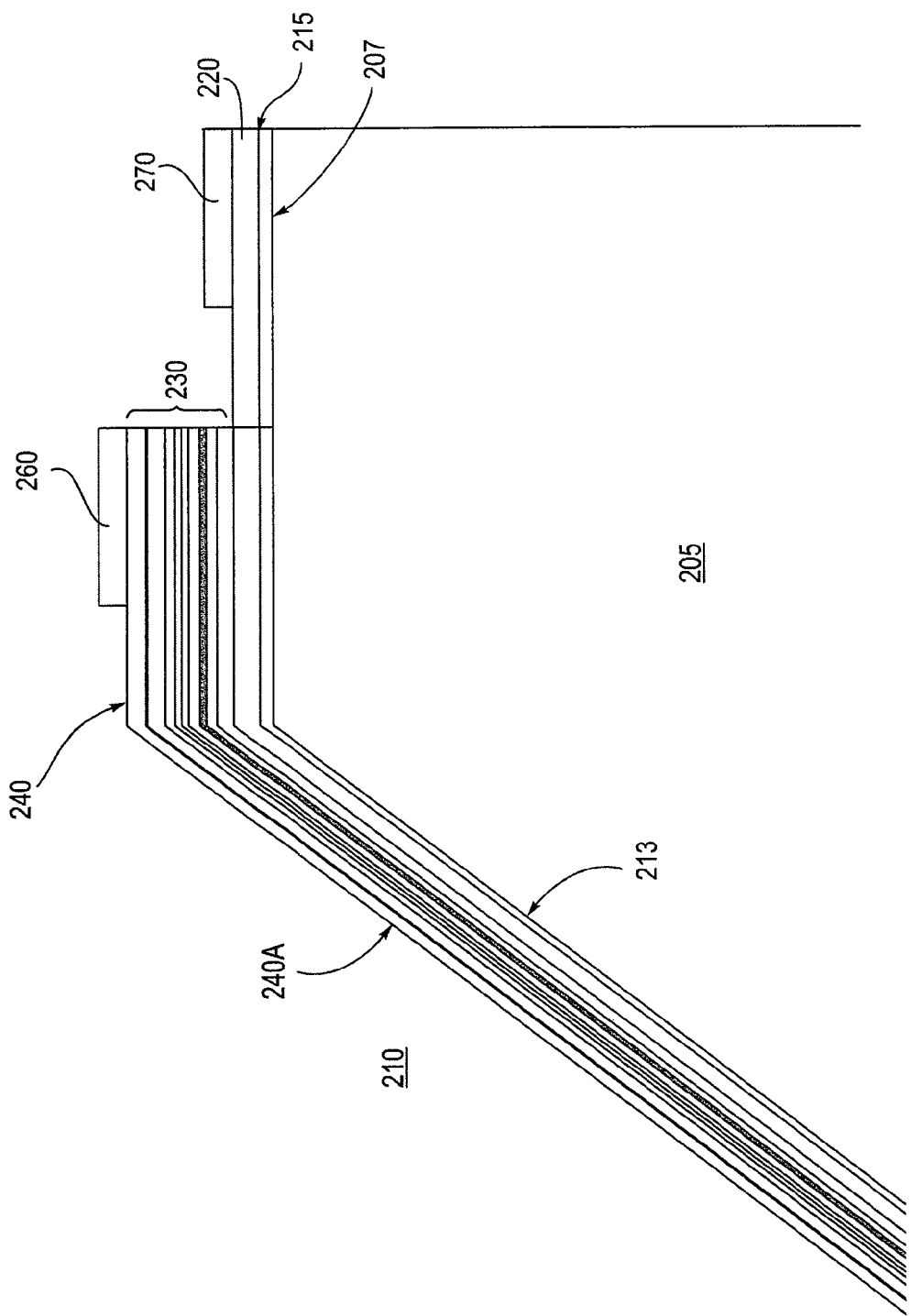
FIG. 3B is a detailed cross-sectional view of a side portion of the light emitting device in FIG. 3A.
Figure 3C:
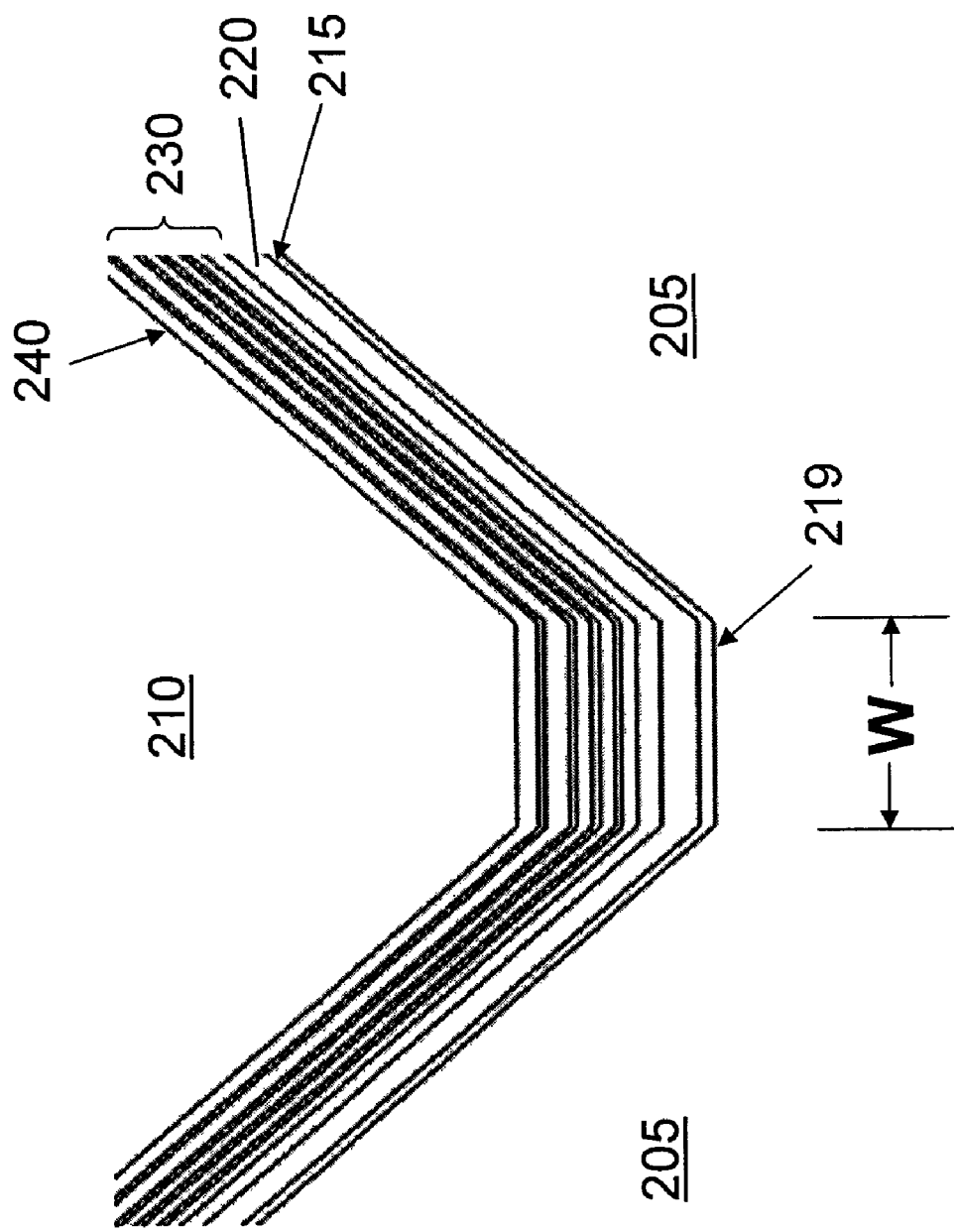
FIG. 3C is a detailed cross-sectional view of the bottom portion of the light emitting device in FIG. 3A.

Referring to FIGS. 2A to 3C, a light emitting device 200 is formed on a substrate 205 having an upper surface 207 (FIG. 3B). The light emitting device 200 includes a trench 210 in the substrate 205 below the upper surface 207. The trench 210 has one or more trench surfaces 213 (FIG. 3B) at a slope relative to the upper surface 207. The trench 210 can also have a bottom surface 219 that is parallel to the upper surface 207. The area of the bottom surface 219 can be kept smaller than 20% of one of the trench surfaces 213. The substrate 205 can be silicon based: the upper surface 207 can be parallel to the (100) crystalline plane. The trench surface 213 can be parallel to the (111) crystalline surface. (Alternatively, the upper surface 207 can be parallel to the (111) crystalline plane. The trench surface 213 can be parallel to the (100) crystalline surface.) The trench 210 thus can have the shape of an inverted pyramid or a truncated inverted pyramid in the substrate 205, which forms a square opening in the upper surface 207. An internal edge 217 is formed at the intersection of two adjacent trench surfaces 213. The substrate 205 can have a rectangular or square shape having an outer edge 208. The light emitting device 200 can be fabricated together with a batch of other light emitting devices on a semiconductor wafer, and diced to form separate dies. The light emitting device 200 can have a rectangular or square die shape defined by a planar area in the plane parallel to the upper surface 207.

The light emitting device 200 includes a reflective buffer layer 215 on the upper surface 207 and the trench surfaces 213, a lower Group III-V compound layer 220 on the reflective buffer layer 215, one or more quantum-well layers 230 on the lower Group III-V compound layer 220, and an upper Group III-V compound layer 240. The lower Group III-V compound layer 220 and the upper Group III-V compound layer 240 each includes a group III element and a group V element. The group III element is typically gallium. The group V element is typically nitride. Group III-V compounds suitable for the lower Group III-V compound layer 220 and the upper Group III-V compound layer 240 can include GaN or InGaAlN. The lower Group III-V compound layer 220 and the upper Group III-V compound layer 240 can be respectively n-type and p-type doped. The portion of the upper Group III-V compound layer 240 over the trench surface 213 is referred to as a sloped upper Group III-V compound layer 240A and is oriented at an angle relative to the upper surface 207 of the substrate 205. The light emitting device 200 also includes a lower electrode 270 on the lower Group III-V compound layer 220 and an upper electrode 260 on the upper Group III-V compound layer 240.

Figure 4A:
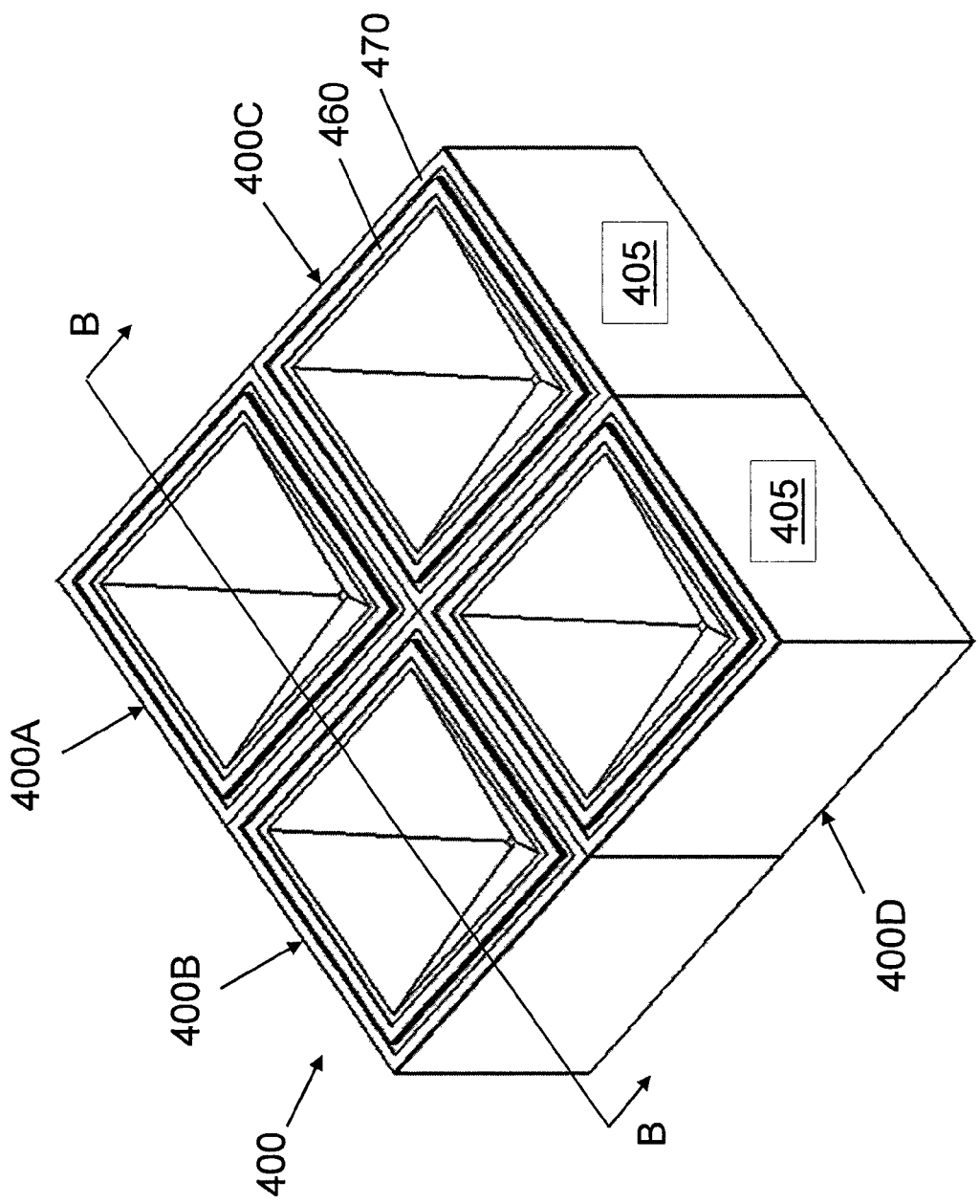
FIG. 4A is a perspective view of a 2×2 array of light emitting structures fabricated on a substrate in accordance with the present application.

In some embodiments, as shown in FIG. 4A, a semiconductor wafer 400 includes a 2×2 array of light emitting structures 400A-400D formed on a substrate 405. Each of the light emitting structures 400A-400D can have a similar structure as that of the light emitting device 200 as described above. The light emitting structures 400A-400D can be formed in a 2×2 matrix on a semiconductor wafer. The light emitting structures 400A-400D can be used as a single light device, or they can be separated by cutting and dicing to form individual light emitting devices similar to the light emitting device 200. In another example, a semiconductor wafer 500 comprising a 4×4 array of light emitting structures 510 is shown FIG. 4C.

Figure 3D:
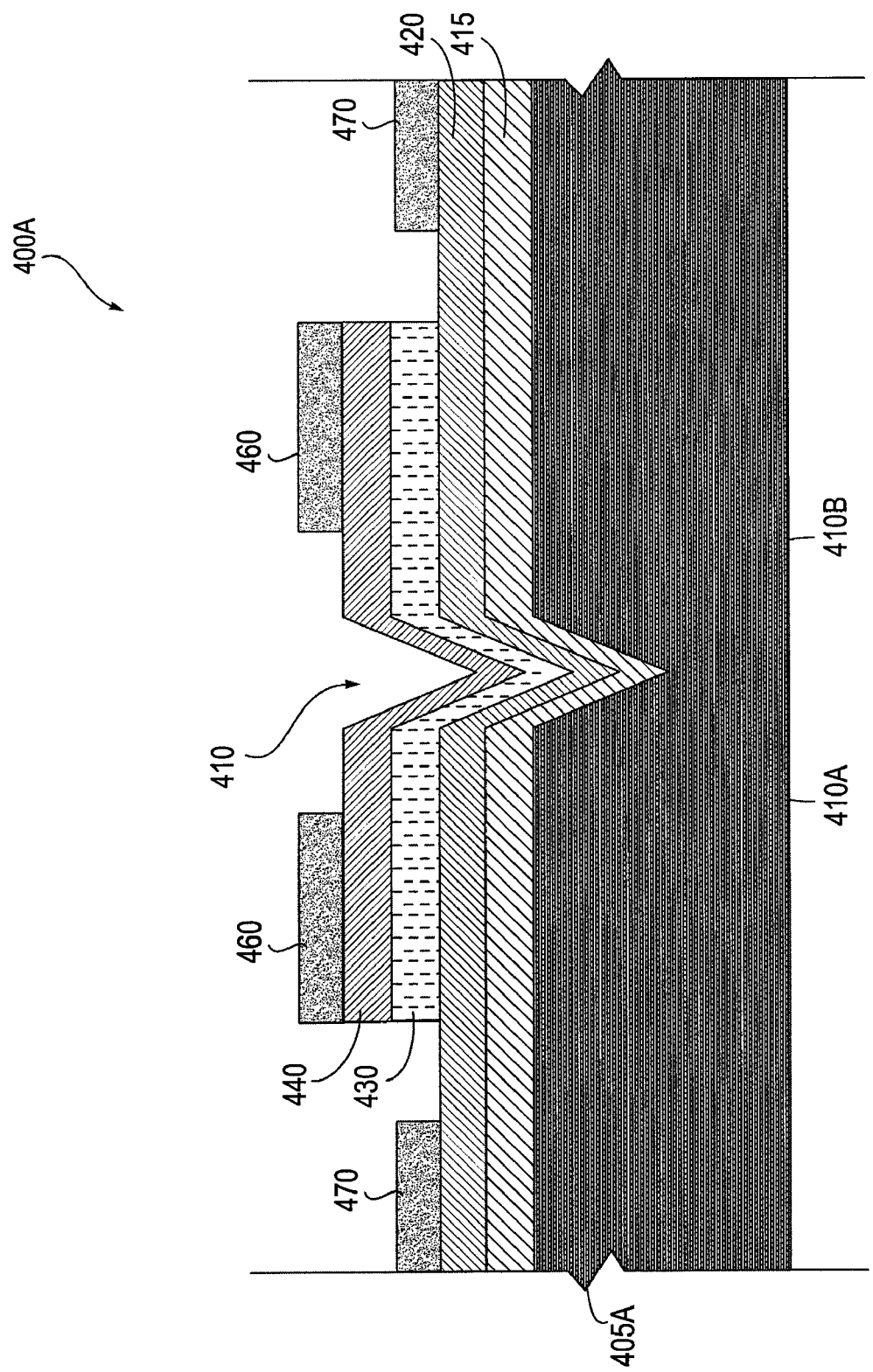
FIG. 3D is a cross-sectional view the light emitting structures along line B-B in FIG. 2A.
Figure 4B:
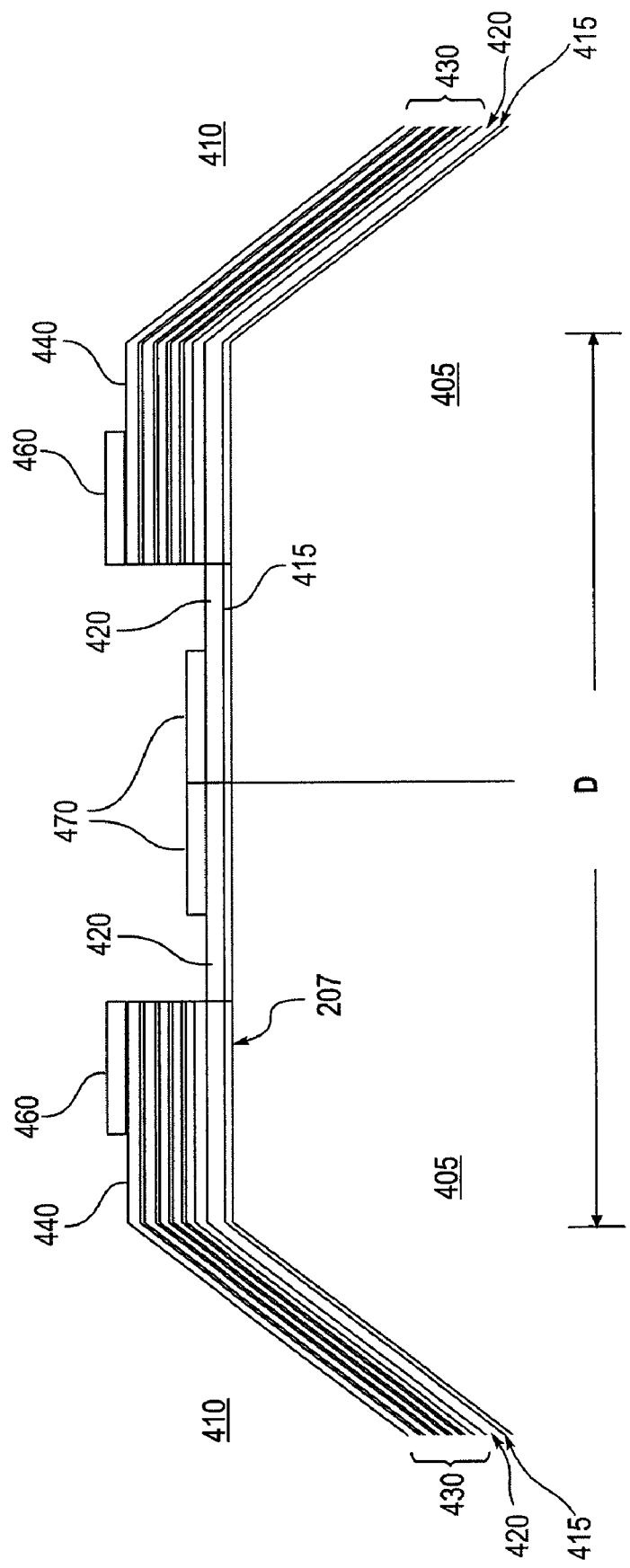
FIG. 4B is a partial cross-sectional view of the light emitting structures along line B-B in FIG. 4A.
Figure 4C:
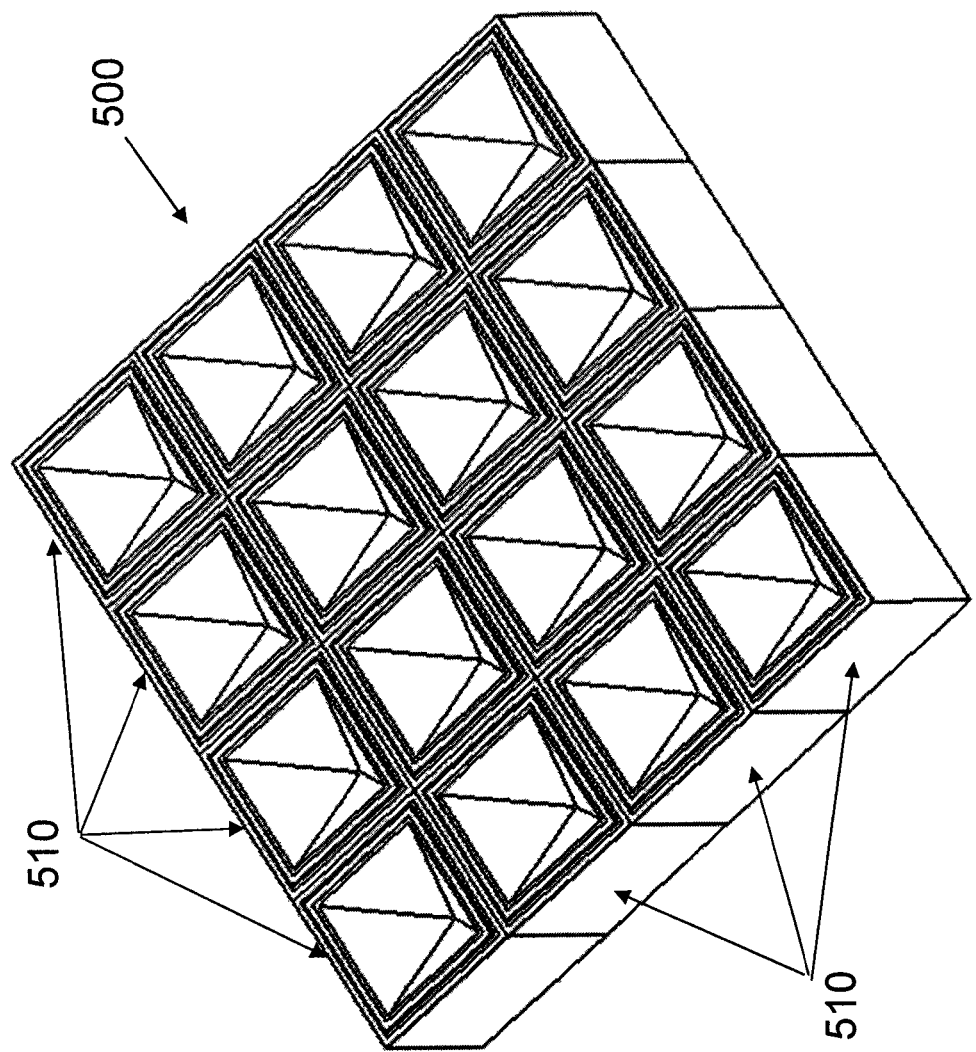
FIG. 4C is a perspective view of a 4×4 array of light emitting structures fabricated on a substrate in accordance with the present application.

Referring to FIGS. 3D and 4B, the light emitting structures 400A, 400B can be formed on trenches 410 in a substrate 405. The substrate 205 can be formed by silicon, silicon oxide, gallium nitride, silicon carbide, sapphire, or glass. The substrate 205 can also be formed by a double-layer structure such as a silicon layer on glass, or simply a silicon-on-insulator (SOI) wafer. The silicon layer can have a (100) upper surface. The thickness of the silicon layer can be used to define the depth of a trench. For a silicon based substrate, the substrate 405 can have an upper surface 405A in the (100) crystalline plane direction. The surfaces 410A, 410B of the trench 410 can be along the (111) crystalline plane direction. The substrate 405 can also include a complimentary metal oxide semiconductor (CMOS) material and a CMOS electric circuitry for driving and controlling the light emitting device 400.

A reflective buffer layer 415 is formed on the surface 405A of the substrate 405 and the sloped surfaces 410A, 410B in the trenches 410. A function of the reflective buffer layer 415 is to reflect light emitted by the light emitting device 400 away from the substrate 405 to prevent the emitted light from being absorbed by the substrate 405. For example, the substrate 405 can be silicon based, which absorbs light in the visible light range. The reflective buffer layer 415 can have a reflectance coefficient higher than 30%, 50%, or 70% in the spectral range for the emitted light from the light emitting device 400.

The reflective buffer layer 415 can be deposited on the substrate 405 using atomic layer deposition (ALD) in a vacuum chamber maintained at a temperature in the range of 550° C. to 850° C., such as about 700° C. The reflective buffer layer 415 can have a thickness of about 200 to 200,000 Angstroms such as 1000 to 10,000 Angstroms. The reflective buffer layer 415 can wet and form a uniform layer on the substrate 405. The reflective buffer layer 415 can also have crystal structures with lattices expitaxially matched to the substrate 405 and the lower Group III-V compound layer 420 (described below).

The ALD formation of the reflective buffer layer 415 can involve the use of TaN or TiN and a layer thickness of 10 to 100 angstroms. Atomic layer deposition (ALD) is a "nano" technology, allowing ultra-thin films of a few nanometers to be deposited in a precisely controlled way. ALD has the beneficial characteristics of self-limiting atomic layer-by-layer growth and is highly conformal to the substrate. For the formation of buffer layer in the light emitting devices, ALD can use two or more precursors such as liquid halide or organometallic in vapor form. The ALD can involve heat to dissociate the precursors into the reaction species. One of the precursors can also be a plasma gas. By depositing one layer per cycle, ALD offers extreme precision in ultra-thin film growth since the number of cycles determines the number of atomic layers and therefore the precise thickness of deposited film. Because the ALD process deposits precisely one atomic layer in each cycle, complete control over the deposition process is obtained at the nanometer scale. Moreover, ALD has the advantage of being capable of substantially isotropic depositions. ALD is therefore beneficial for depositing buffer layers on the sloped surfaces 410A and 410B in the V-shape trenches, and the vertical surfaces in a U-shape trench.

A lower Group III-V compound layer 420 is formed on the reflective buffer layer 415. The lower Group III-V compound layer 420 can be formed by silicon doped n-GaN. The lower Group III-V compound layer 420 can have a thickness in the range of 1 to 50 microns, such as 10 microns.

The material for the reflective buffer layer 415 is selected to satisfy the requirements of high reflectivity and lattice matching with the substrate 405 and a lower Group III-V compound layer 420. For example, the reflective buffer layer 415 can be formed by Al, aluminum nitride, Al oxide, Ag, Ag oxide, Au, Au oxide, and their alloys of Al, Au and Ag. The reflective buffer layer 415 can be also formed by one or more materials such as TaN, TiN, GaN, ZnO, MN, HfN, AlAs, or SiC. The reflective buffer layer 415 can have a thickness in the range of 200 to 200,000 Angstroms, such as 1,000 to 10,000 Angstroms.

A quantum-well layer 430 is formed on the lower Group III-V compound layer 420. The quantum-well layer 430 can be made of InN or InGaN with a thickness in the range of 5 to 200 Angstroms, such as 50 Angstroms. An upper Group III-V compound layer 440 is formed on the quantum-well layer 430. The upper Group III-V compound layer 440 can be formed by p-type doped GaN such as $Al_{0.1}Ga_{0.9}N$. The upper Group III-V compound layer can be an aluminum doped p-GaN layer 440 having a thickness in the range of 0.1 to 10 microns, such as 1 micron. The quantum-well layer 430 forms a quantum well between the lower Group III-V compound layer 420 and the upper Group III-V compound layer 440. A conductive layer 450 is optionally formed on the upper Group III-V compound layer 440. The conductive layer 450 is at least partially transparent. Materials suitable for the conductive layer 450 can include ITO or a thin layer p-type ohmic metal such as Ni/Au. An upper electrode 460 can be formed on the conductive layer 450 (or the upper Group III-V compound layer 440 in absence of the conductive layer 450). The inclusion of the conductive layer 450 can be based on whether the substrate 405 is thinned to all allow more emitted light to exit the light emitting device 400. The conductive layer 450 is preferably included if the substrate 405 is not thinned so more light can exit the Light emitting device 400. A lower electrode 470 can then be formed on the lower Group III-V compound layer 420. The upper electrode 460 and lower electrode 470 can be respectively referred as p-electrode and n-electrode. The use of transparent ITO material in the conductive layer 450 can significantly increase the conductivity between the electrode 460 and the upper Group III-V compound layer 440 while maximizing the transmission light out of the upper surface of the conductive layer 450 emitted from the quantum-well layer 430.

The quantum-well layer 430 can form a quantum well for electric carriers in between the lower Group III-V compound layer 420 and the upper Group III-V compound layer 440. An electric voltage can be applied across the lower electrode 470 and the upper electrode 460 to produce an electric field in the quantum-well layer 430 to excite carriers in the quantum well formed by the quantum-well layer 430, forming a quantum well for electric carriers in between the lower Group III-V compound layer 420 and the upper Group III-V compound layer 440. The recombinations of the excited carriers can produce light emission. The emission wavelengths are determined mostly by the bandgap of the material in the quantum-well layer 430.

In the present specification, the term "quantum well" refers to a potential well that confines charge carriers or charged particles such as electrons and holes to a substantially two-dimensional planar region. In a semiconductor light emitting device, the quantum well can trap excited electrons and holes and define the wavelength of light emission when the electrons and the holes recombine in the quantum well and produce photons.

In the present specification, a quantum-well layer can include a uniform layer or a plurality of quantum wells. For example, a quantum-well layer (e.g., 430 in FIGS. 5E to 5I) can include a substantially uniform layer made of InN, GaN, InGaN, AlGaN, InAlN, or AlInGaN. A quantum-well layer can also include a multi-layer structure defining one or more quantum wells. A quantum well can for example be formed by an InGaN, an AlGaN, an InAlN, or an InGaAlN layer sandwiched in between two GaN layers. A quantum well can also be formed by an InGaN layer sandwiched in between GaN or AlGaN layers. The quantum-well layer can include one or a stack of such layered structure each defining a quantum well as described above.

The bandgap for InN is about 1.9 eV, lower than the bandgap for GaN that is at about 3.4 eV. The lower bandgap of the InN or the InGaN layer can define a potential well for trapping charge carriers such as electrons and holes. The trapped electrons and holes can recombine to produce photons (light emission). The bandgap in the InN or the InGaN layer can therefore determine the colors of the light emissions. In other words, the colors of light emissions can be tuned by adjusting the compositions of In and Ga in InGaN. For example, a quantum well can produce red light emission from an InN layer, green light emission from an In(0.5)Ga(0.5)N layer, and blue light emission from an In(0.3)Ga(0.7)N in the quantum-well.

In one aspect, the disclosed light emitting device can include a substrate having a first surface and a second surface not parallel to the first surface; and a light emission layer disposed over the second surface to emit light, the light emission layer having a light emission surface which is not parallel to the first surface. By stating that one layer is disposed "over" or "above" another layer, this does not necessarily mean that the two layers must be in direct contact with each other; indeed, there may be one or more additional layers in between, as will be further apparent from other portions of this description. In another aspect, the disclosed light emitting device can include a substrate; and a light emission layer disposed over the substrate to emit light, the light emission layer having a footprint area and having a light emission surface area which is greater than the footprint area. In another aspect, the disclosed light emitting device can include a substrate having a first surface and a protrusion formed on the first surface; and a light emission layer disposed on the protrusion to emit light, the light emission layer having a light emission surface which is not parallel to the first surface.

Figures 3E, 3F:
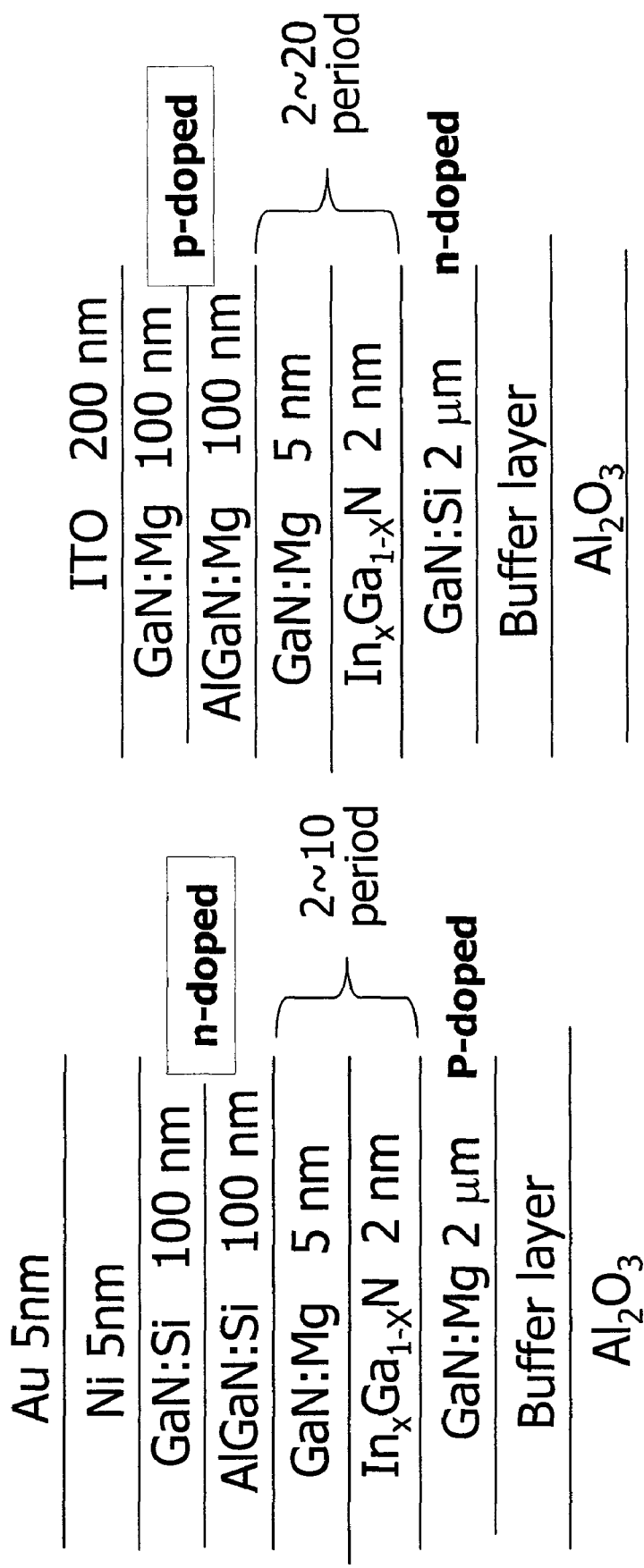
FIGS. 3E and 3F illustrate examples of layer structures and material compositions for the light emitting structures.

FIGS. 3E and 3F respectively illustrate other examples of layer structures and material compositions for the light emitting structures, which can include trenches, protrusions such as pyramids, and other structures including a sloped surface not parallel to the upper surface of the substrate. The layers are shown in the horizontal direction only for the purpose of illustration. The sequence, thicknesses, and compositions described the layers on the sloped surfaces in the trenches or on the protrusions as well as the upper surface of the substrate. An $Al_2O_3$ layer below the buffer layer can provide the reflectivity needed to reflect the light emission away from the substrate. The quantum well layers can be formed by two to ten periods of GaN:Mg and $In_xGa_{1-x}N$ layers. The GaN:Mg layer can for example be about 5 nm thick. The $In_xGa_{1-x}N$ layer can for example be about 2 nm thick. The lower Group III-V compound layer can be made of GaN doped with Mg or Si, and approximately 2 μm in thickness. The upper Group III-V compound layers can be made of GaN doped with Mg or Si, AlGaN doped with Mg or Si, and can be approximately 100 nm in thickness. The upper electrode can be formed by an ITO layer approximately 200 nm in thickness or a bi-layer of respectively made of Ni and Au.

In some embodiments, more than one reflective buffer layer can be formed on the substrate 405. A first buffer layer and a second buffer layer are sequentially formed on the substrate 405. At least the second buffer layer is reflective. The combined reflectance coefficient for the first buffer layer and the second buffer layer are higher than 30%, 50%, or 70% in the spectral range for the emitted light from the light emitting device. A lower Group III-V compound layer is then formed on the second reflective buffer layer. The quantum-well layer, the upper Group III-V compound layer, the conductive layer, the upper electrode, and the lower electrode can then be formed successively to form the light emitting device.

It should be noted that the light emitting structures in the wafers 400, 500 can be separated by dicing and cutting to form individual light emitting devices, each of which can be powered to emit light in separate applications. The light emitting structures in the wafers 400, 500 each can also be used as an integrated light emitting device. The lower electrodes of the light emitting structures in the wafers 400 or 500 can be electrically connected to allow them to be connected to a common external electrode. The upper electrodes of the light emitting structures in the wafers 400 or 500 can be connected to different external electrodes, which allow the light emitting structures in the wafers 400 or 500 to be individually addressed for turning on and off. The upper electrodes of the light emitting structures in the wafers 400 or 500 can also be connected to a common external electrode to allow the light emitting structures in the wafers 400 or 500 to be turned on and off as a group to provide a large-area light emitting device.

Another advantage of the described light emitting devices is that the disclosed Light emitting devices and fabrication processes can overcome differential thermal expansions and lattice mismatch between the lower Group III-V compound layers and the substrate and prevent associated layer cracking and delamination. It is known that the severity of the lattice mismatch and differential thermal expansions increase as a function of the lateral contact dimensions between the lower Group III-V compound layer and the substrate (or the buffer layer). Conventional LED light devices are often manufactured on 2-inch and 4-inch substrate and can thus suffer from large distress at the contact area between the lower Group III-V compound layer and the substrate (or the buffer layer). The lattice mismatch and differential thermal expansions are much larger for the (100) surface than for the (111) surface for a silicon-based substrate.

The disclosed light emitting devices breaks down the large (100) surface areas by segmented (111) trench surfaces and the (100) upper surfaces between the trenches. The openings of the trenches (210 in FIGS. 3A-3C) can be in a range between 100 microns to 100 mm, such as 1 to 20 mm. The width "D" of the (100) upper surface 207 (FIG. 4B) can be kept narrow, for example, to be less than 1000 microns, which is much shorter than the width of the wafer substrate for fabricating convention LED light emitting devices. Similarly the width "W" of the bottom surface 215 (FIG. 3C) can be kept narrow, for example, to be less than 200 microns. By keeping these dimensions small, stress related to differential thermal expansions and lattice mismatch can thus be drastically reduced.

Figure 6B:
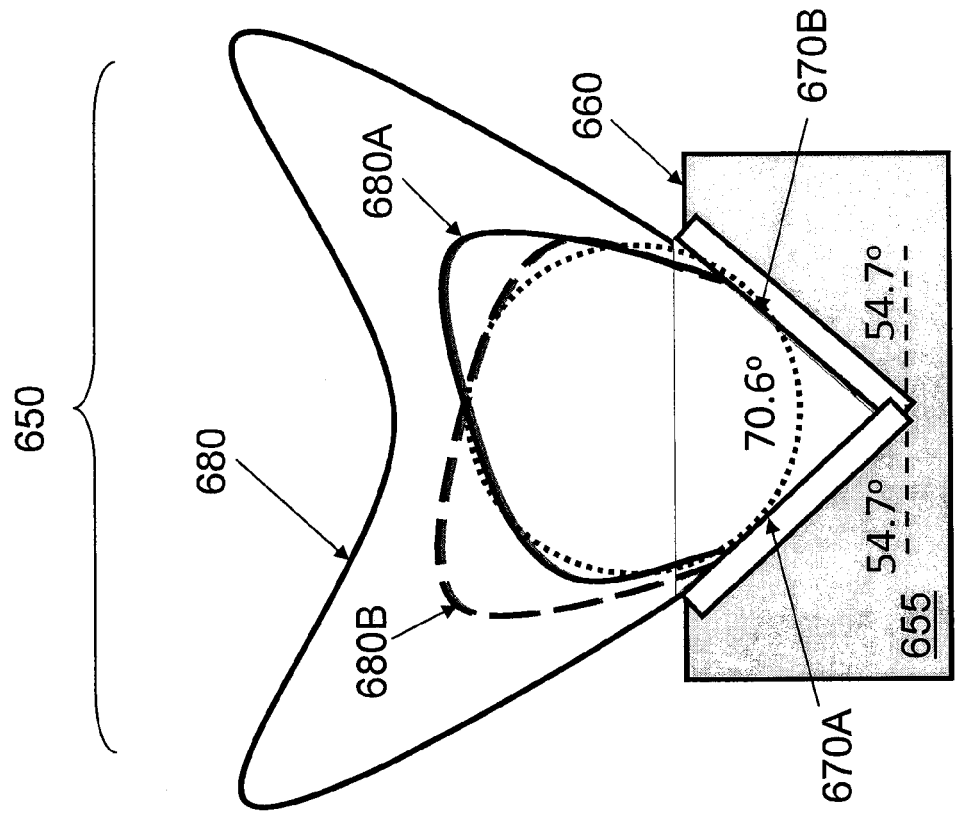
FIG. 6B is a schematic diagram illustrating angular distribution of light emission from the light emitting device illustrated in FIG. 2A.
Figure 6A:
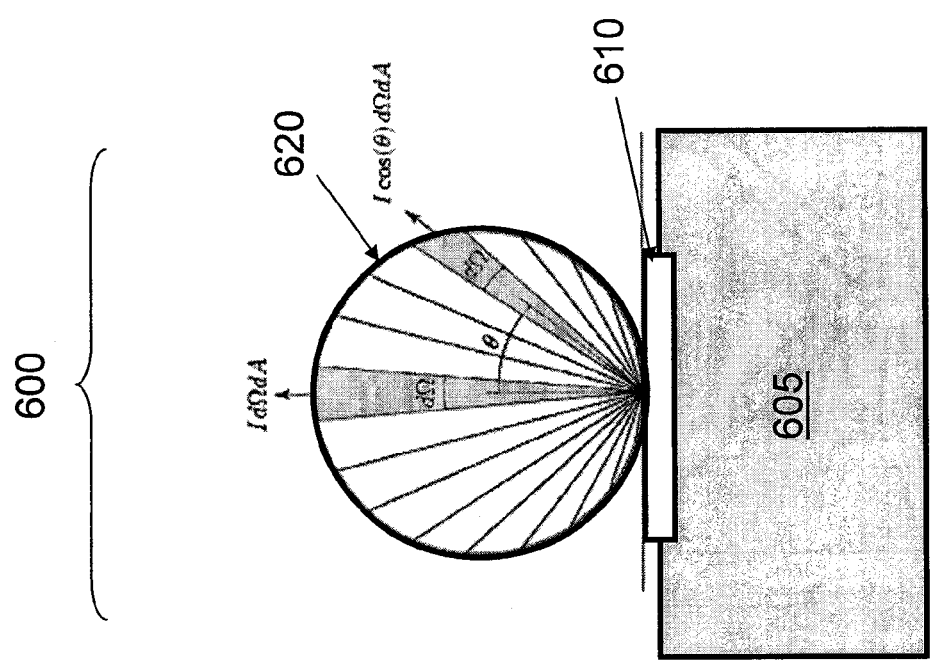
FIG. 6A is a schematic diagram illustrating an example of the emission angular distribution of a conventional LED light emitting device.

The described light emitting devices can produce significantly higher emission light intensity than conventional LED devices. Referring to FIGS. 6A and 6B, a conventional LED light emitting device 600 includes a flat emission surface 610 on a substrate 600. A light emitting device 650 according to the present application includes a substrate 655 having an upper surface 660 and a trench having sloped emission surfaces 670. For a silicon based substrate, the upper surface can be along the (100) crystalline plane and the sloped emission surfaces 670A, 670B parallel to the (111) crystalline planes. The sloped emission surfaces 670A, 670B are at a 54.7° angle relative to the upper surface 660. For the same foot print on the upper surface 660, the sum of the areas of the emission surfaces 670A, 670B, measured along each of those surfaces, is $1/(\cos(54.7°)$ of (i.e., approximately 1.73 times) the area of the flat emission surface 610 in the conventional LED device 600. The disclosed light emitting devices are compatible with other substrate materials and relative orientations of the sloped trench surfaces. It should be understood that the disclosed light emitting devices are compatible with other substrate materials and relative orientations of the sloped trench surfaces. The sloped trench surface can be at an angle between 20 degrees and 80 degrees, or as a more specific example, between 50 degrees and 60 degrees relative to the upper surface of the substrate.

The emission surfaces in a trench in the disclosed light emitting device can be more than one time, or 1.2, or 1.4, or 1.6 times of the area of the trench openings. The large emission surface areas in the described light emitting devices allow the disclosed light emitting device can thus generate much higher light emission intensity than conventional LED devices. For a light emitting device (e.g., 200 in FIG. 2A) formed on an individual die, the emission surfaces provided by the sloped trench surfaces in sum can have a larger area than the planar area of the light emitting device (e.g., the footprint area of the light emitting device 200 in FIG. 2A).

Another advantage of the described light emitting devices is that they can emit light in more concentrated angular range than conventional LED devices. Referring again to FIGS. 6A and 6B, the flat emission surface 610 emits light in a 180 angular range. The angular emission distribution 620 has a 360 degree rotational symmetry relative to the substrate normal direction. The light emitting device 650 includes sloped emission surfaces 670A and 670B emit light according to angular distributions 680A and 680B respectively, which combine to give an emission angular distribution 680. The emission angular distribution 680 has a 90 degree rotational symmetry relative to the substrate normal direction and a 70.6° angular width, less than half of the angular range in the angular emission distribution 620 in the conventional LED light emitting device 600. The emission of the light emitting device 650 is therefore much more concentrated and efficient than conventional LED light emitting devices. The disclosed light emitting devices are compatible with other substrate materials and relative orientations of the sloped trench surfaces. The light emitted from the sloped trench surfaces can be confined in an angular range narrower than 150 degrees, 120 degrees, 100 degrees, or 80 degrees, to provide different degrees of angularly concentrated light emission.

Figure 1:
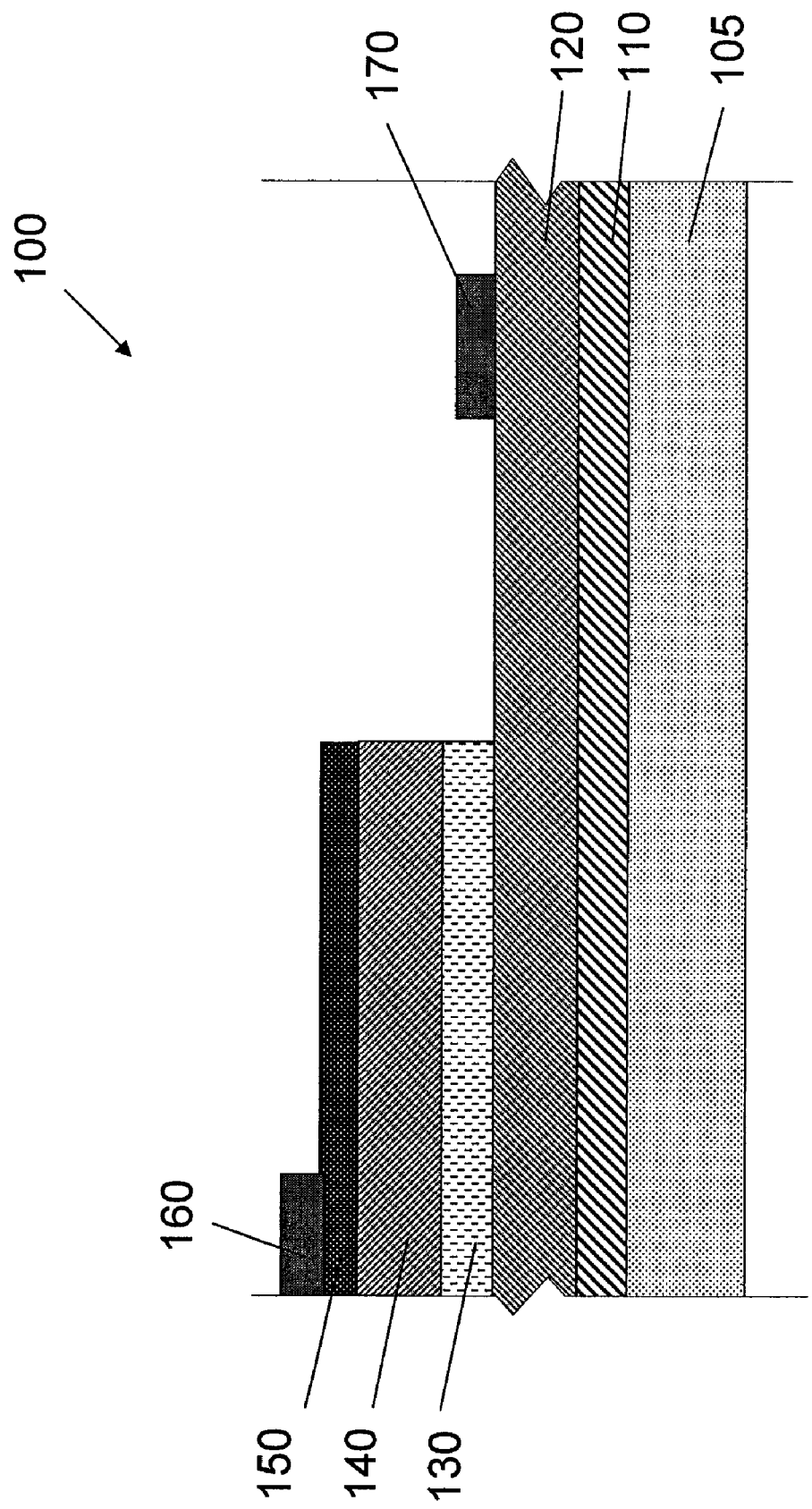
FIG. 1 is a cross-sectional view of a conventional LED structure.
Figure 2A:
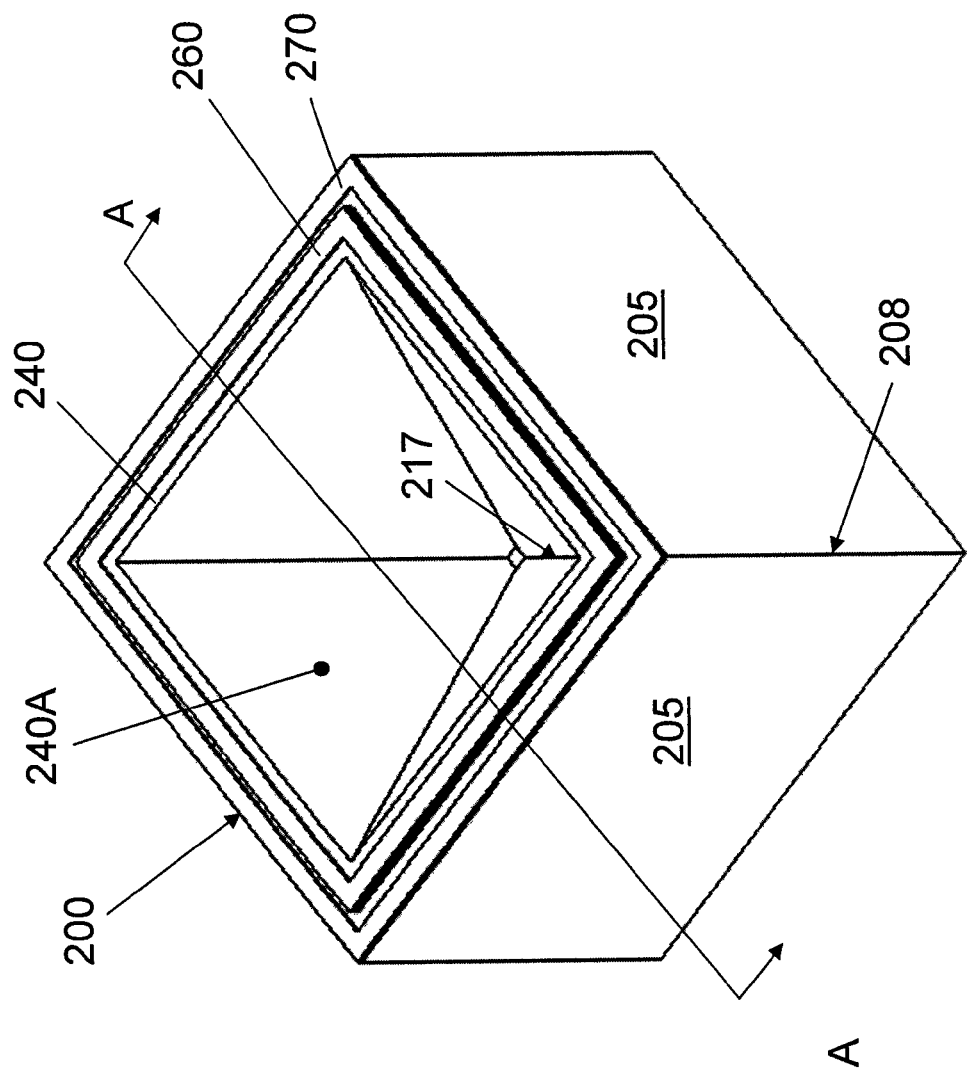
FIG. 2A is a perspective view of a light emitting device in accordance with one embodiment of the present application.
Figure 2B:
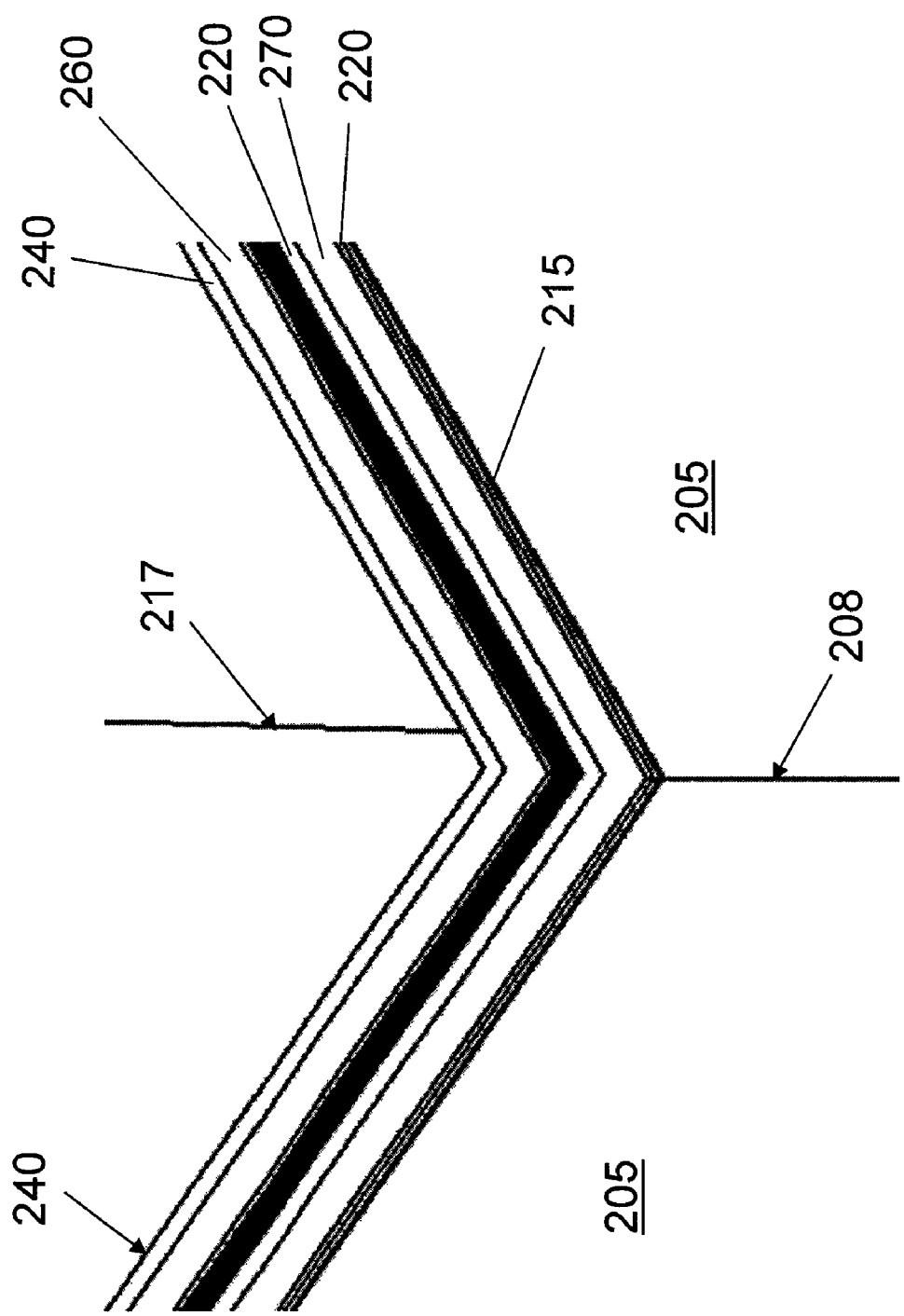
FIG. 2B is a detailed perspective view of the front corner portion of the light emitting device in FIG. 2A.
Figure 5A:
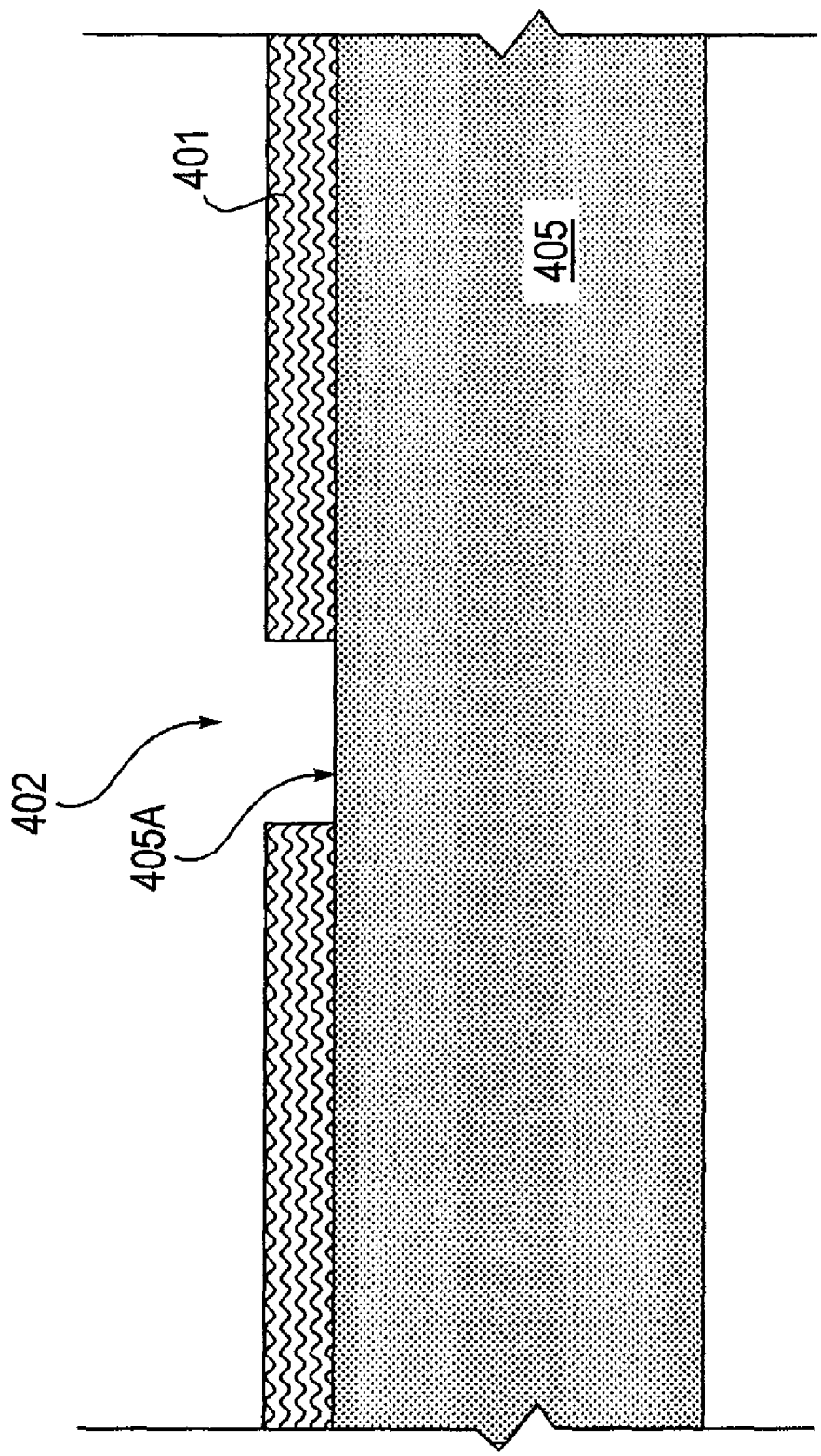
FIG. 5A is a cross-sectional view of a substrate having a patterned mask for preparing for forming the light emitting device of FIG. 4B.
Figure 5C:
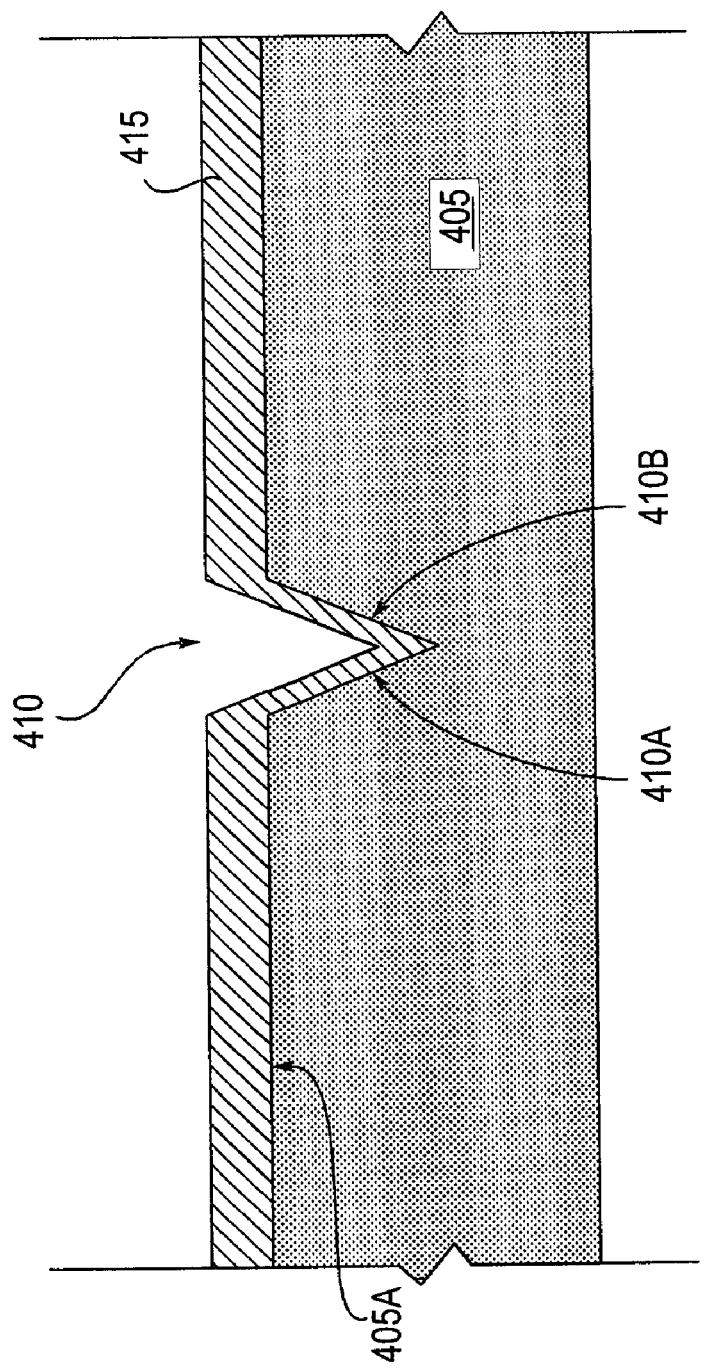

Referring to FIGS. 5A-5I, and 8, the fabrication process of the light emitting device 400 (200, 300, or 600) can include the following steps. It should be noted that the process is described using trenches as an example for the light emitting structure. The process is applicable to other light emitting structures such as protrusions (e.g., pyramids) and other different structures that include sloped surfaces not parallel to their respective upper surfaces of the substrates. A mask layer 401 is formed on the substrate 405 (FIG. 5A). The substrate 405 has an upper surface 405A. The openings 402 in the mask layer 401 are intended to define the locations and the openings of the trenches to be formed. One or more trenches 410 are formed in a substrate 405 (step 810, FIGS. 5B1 and 5B2). The trench 410 can be formed by chemically etching of the substrate 405. Wet etch is isotropic along all directions. For example, an etchant may have a slower etching rate for the (111) silicon crystal plane than in other crystalline plane directions. The etchant (e.g., KOH) can thus create trenches 410 in the substrate 405 wherein the trench surfaces 410A, 410B are along the (111) silicon crystal planes. Etching can undercut the silicon underneath the hard mask layer 401 to form the hangover of the (hard) mask layer 401 on top of Si(100) wafer (FIG. 5B1). The hard mask layer 401 is subsequently removed (a shown in FIG. 5B2).

One or more buffer layers can next be next formed on the substrate 405 using atomic layer deposition (ALD) or MOCVD (step 820). For example, a first buffer layer 213 (or 210) is next formed on the substrate 205 using atomic layer deposition (ALD) (step 820). The substrate 205 can have an upper surface oriented in the (100) crystalline plane. The buffer layer 213 or 210 can be formed of GaN, ZnO, AlN, HfN, AlAs, or SiC. The atomic layer deposition of the buffer material can be implemented using commercial equipment such as IPRINT™ Centura® available from Applied Materials, Inc. The atomic layer deposition can involve the steps of degassing of a vacuum chamber, the application of a precursor material, and deposition of the buffer material monolayer by monolayer. The substrate (or the chamber) temperature can be controlled at approximately 600° C. The layer thickness to form nucleation in an ALD process can be as thin 12 angstrom, much thinner than the approximately thickness of 300 angstrom required by MOCVD for buffer layer formation in some convention LED structure (e.g., the LED structure 100 depicted in FIG. 1). The step 820 can also be referred as ALD of a low temperature buffer layer.

A reflective buffer layer is deposited on the substrate 205 using atomic layer deposition (ALD) in a vacuum chamber maintained at a relatively lower temperature in a range of 550° C. to 850° C., such as 6700° C. A second buffer layer can be deposited on the first buffer layer using atomic layer deposition (ALD) in a vacuum chamber maintained at a relatively higher temperature in a range of 850° C. to 1250° C., such as 1,000° C. The reflective buffer layer can be formed of Al, an Al oxide, Ag, an Ag oxide, Au, an Au oxide, and an alloy comprising Al, Ag, or Au. The reflective buffer layer can also include GaN, ZnO, AlN, HfN, AlAs, or SiC. The reflective buffer layer can have a thickness of about 20-300 Angstroms. The crystal structure of the reflective buffer layer can have lattices expitaxially matched to the substrate and the lower Group III-V compound layer to reduce the strain in the lattice structural transition from the substrate to the lower Group III-V compound layer, which can reduce the chance for cracking and delamination in the multi-layer structure.

For the light emitting device 400, the reflective buffer layer 415 can be formed by MOCVD, PVD, ALD, or molecular beam epitaxy (MBE) on the surface 405A of the substrate 405 and the sloped surfaces 410A, 410B in the trenches 410. The reflective buffer layer 415 can be formed by ALD of TaN or TiN materials. In other examples, the formation of the reflective buffer layer 415 can include one of the following procedures: depositions of AlN at 1000° C. and GaN at 1000° C. using MOCVD, deposition of GaN at 700° C. using MOCVD followed by deposition of GaN at 1000° C. using MOCVD, deposition of HfN at 500° C. using PVD followed by deposition of GaN using MBE at 700° C., and deposition of SiCN at 1000° C. using MOCVD followed by deposition of GaN at 1000° C. using MOCVD.

An advantage for forming the reflective buffer layer 415 on the surfaces 410A and 410B in the V-shape trenches 410 is that the (111) crystalline direction of the surfaces 410A and 410B can allow better lattice matching between silicon substrate, the reflective buffer layer 415, and the lower Group III-V compound layer 420. Better lattice matching can significantly reduce the cracking problems caused by lattice mismatches in some convention light emitting devices.

Figure 5D:
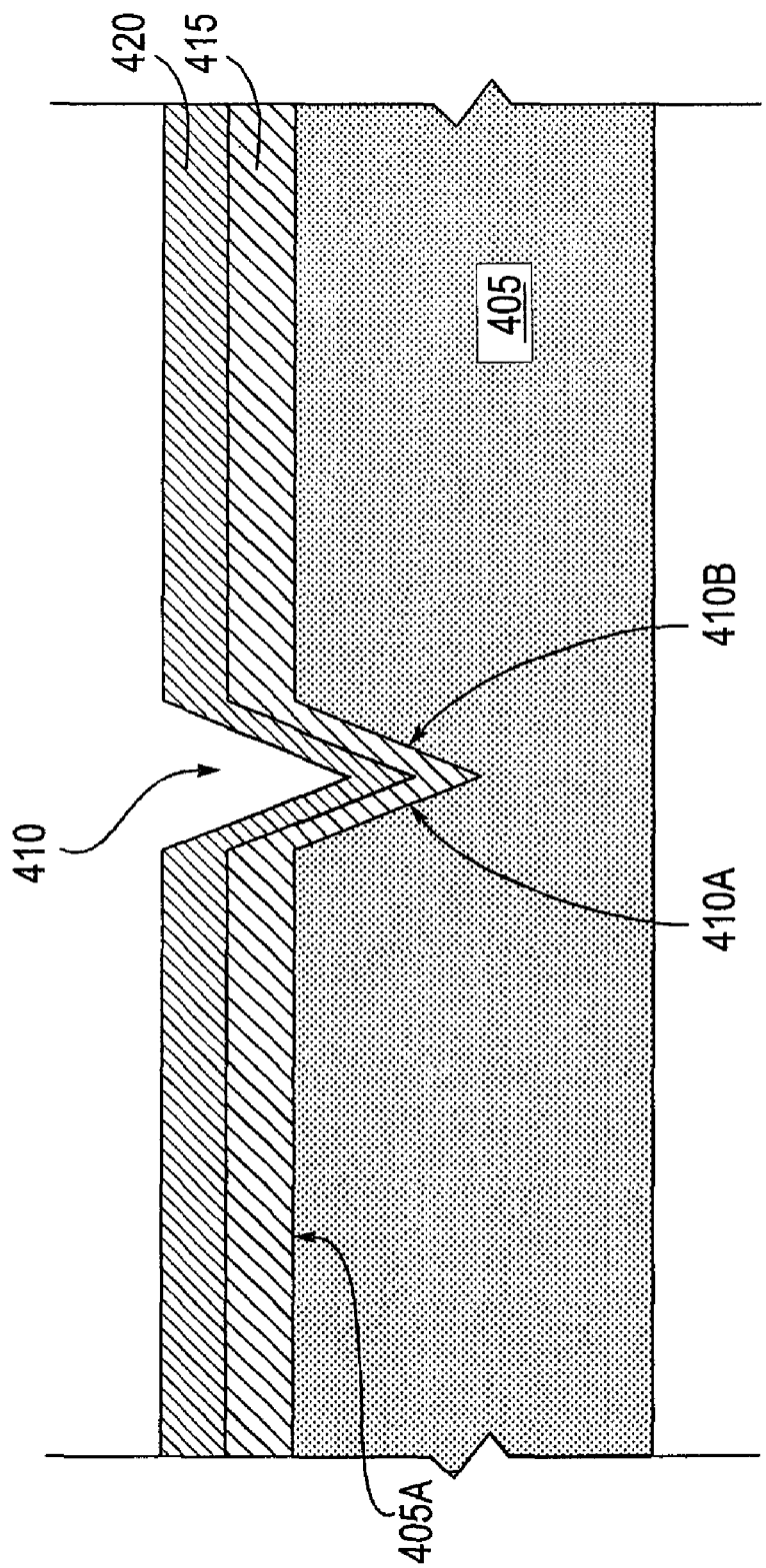

A lower Group III-V compound layer 420 is next formed on the reflective buffer layer 415 (step 830, FIG. 5D). The lower Group III-V compound layer 420 can be formed by an n-type doped GdN material. GaN can be grown on the reflective buffer layer 415 using MOCVD while silicon is doped. The silicon doping can enhance tensile stresses to make the compression and tensile strengths more balanced. As a result, cracks can be substantially prevented in the formation of the lower Group III-V compound layer 420.

Figure 5E:
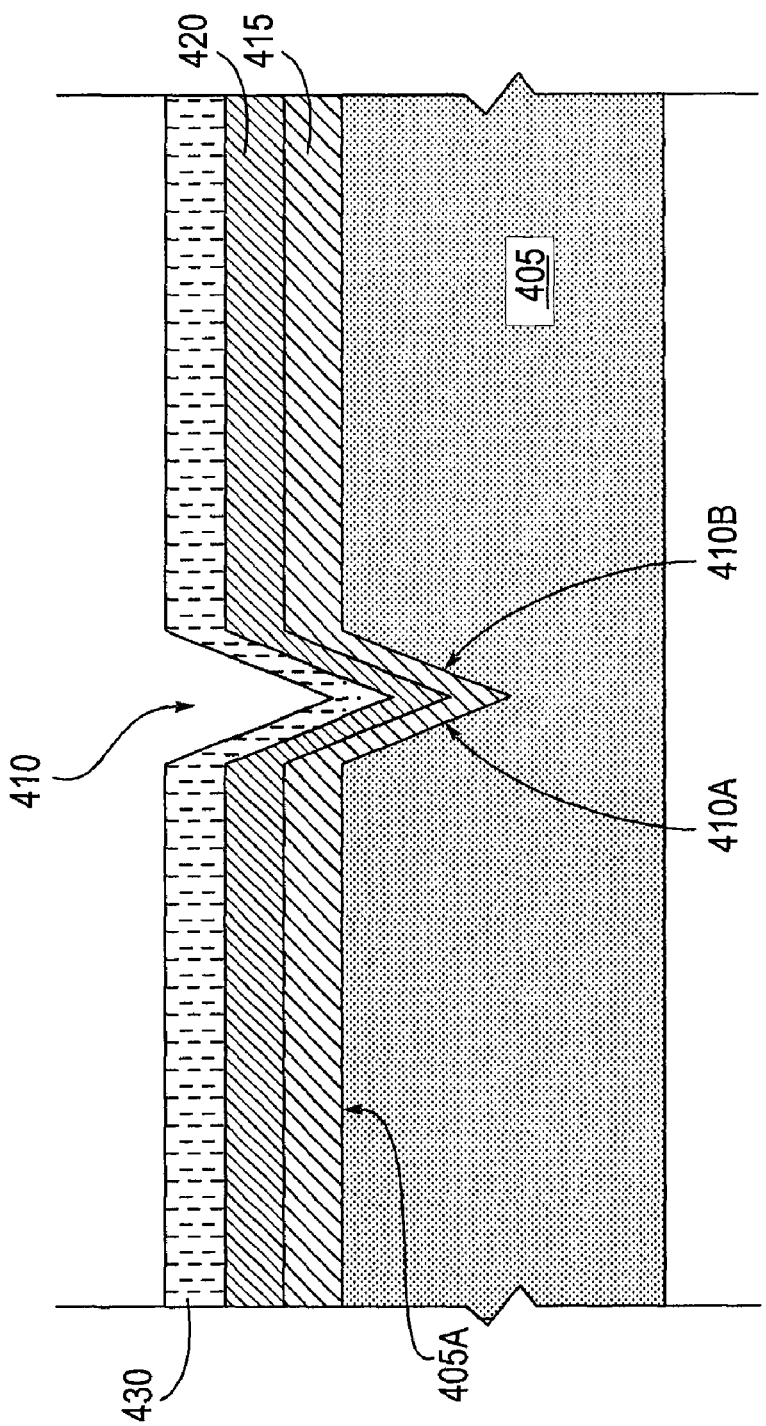

A quantum-well layer 430 is next formed on the lower Group III-V compound layer 430 (step 840, FIG. 5E). The quantum-well layer 430 can include can include a substantially uniform layer made of InN, GaN, InGaN, AlGaN, InAlN, or AlInGaN. The quantum-well layer 430 can also include a multi-layer structure defining one or more quantum wells. A quantum well can for example be formed by an InGaN, an AlGaN, an InAlN, or an InGaAlN layer sandwiched in between two GaN layers or AlGaN layers. The quantum-well layer 430 can include one or a stack of such layered structure each defining a quantum well.

Figure 5F:
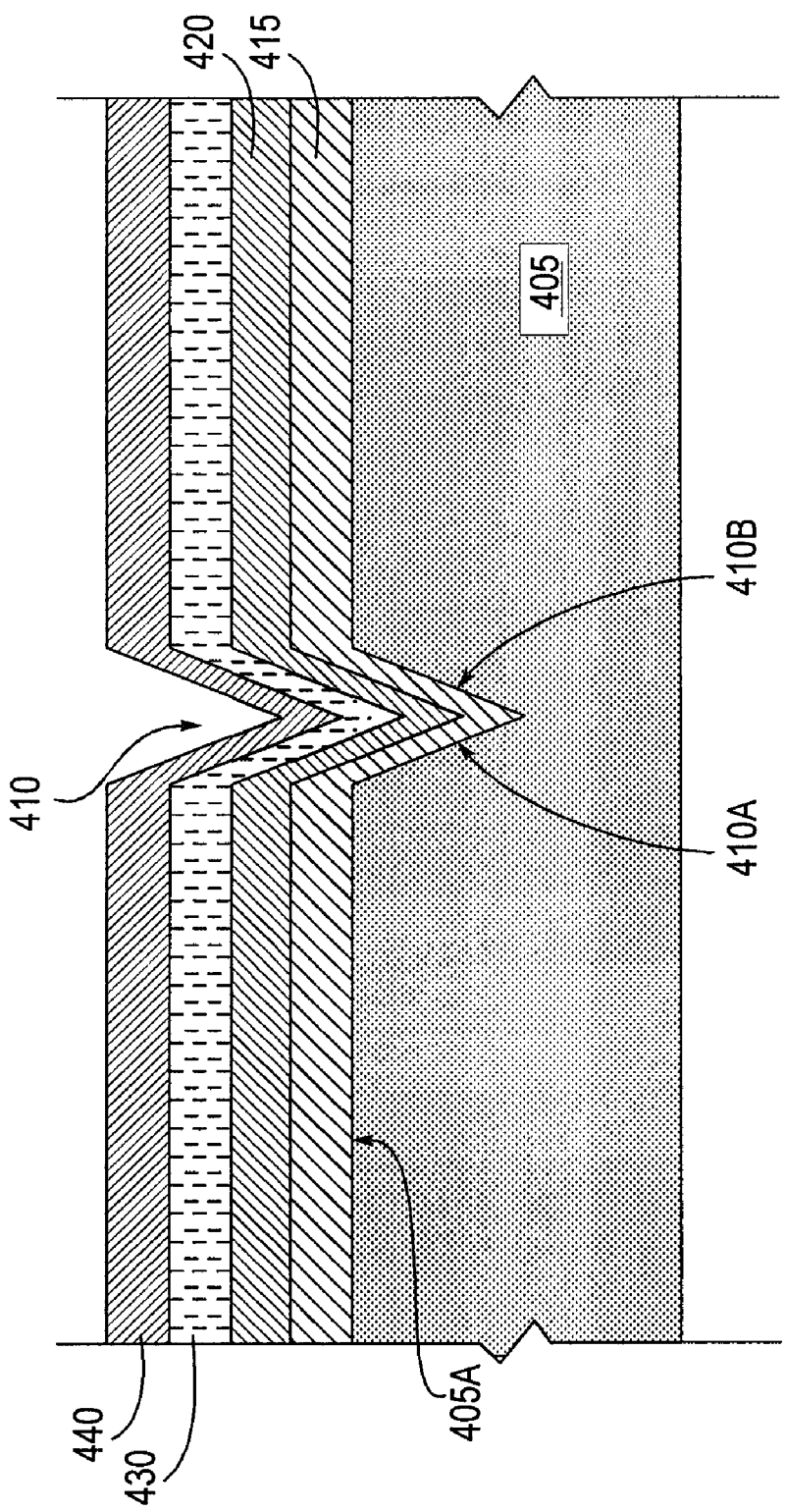
Figure 9A:
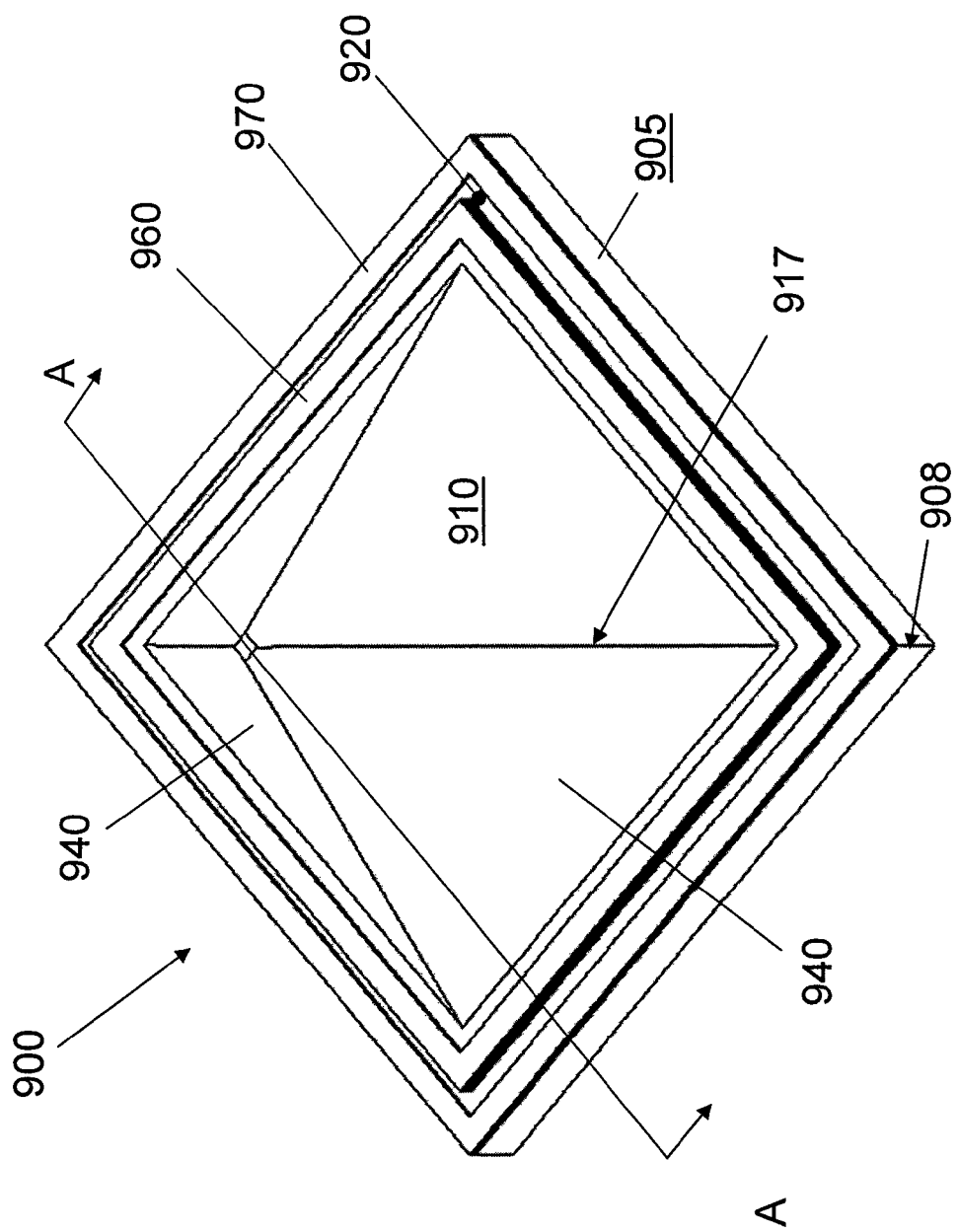
FIG. 9A is a perspective view of a light emitting device in accordance with another embodiment of the present application.
Figure 9B:
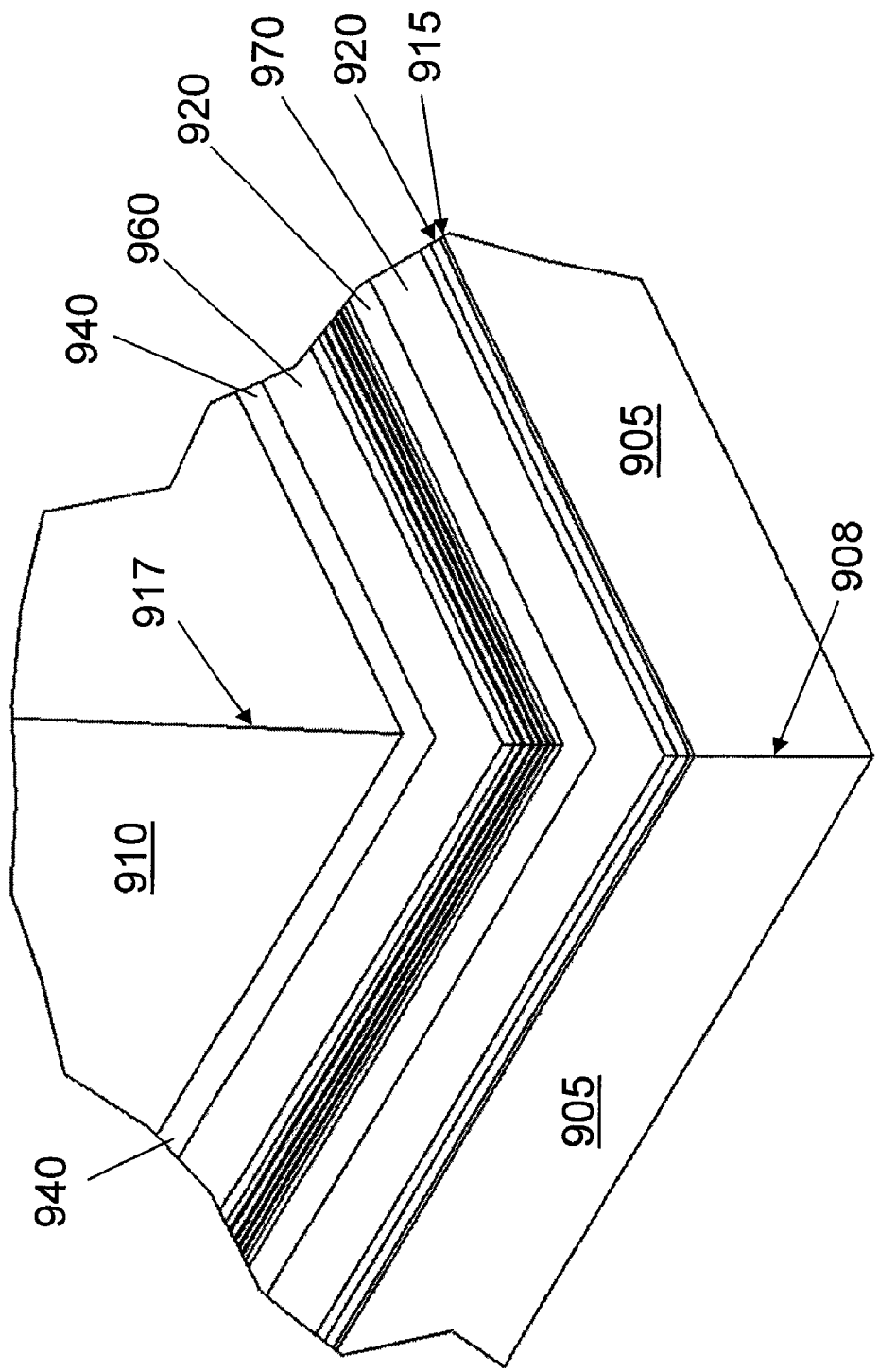
FIG. 9B is a detailed perspective view of the front corner portion of the light emitting device in FIG. 9A.
Figure 10A:
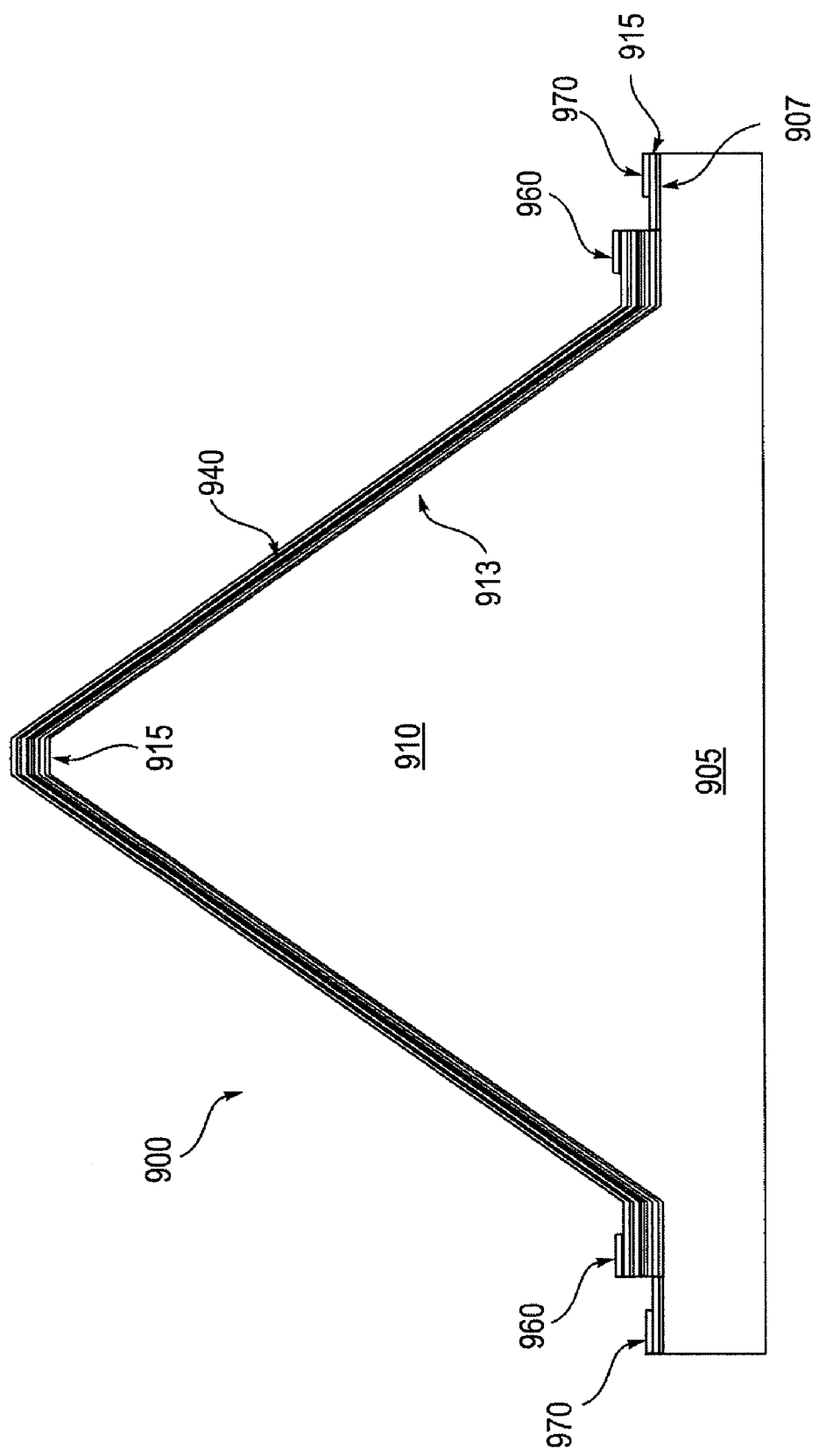
FIG. 10A is a cross-sectional view of the light emitting device along line A-A in FIG. 9A.
Figure 10B:
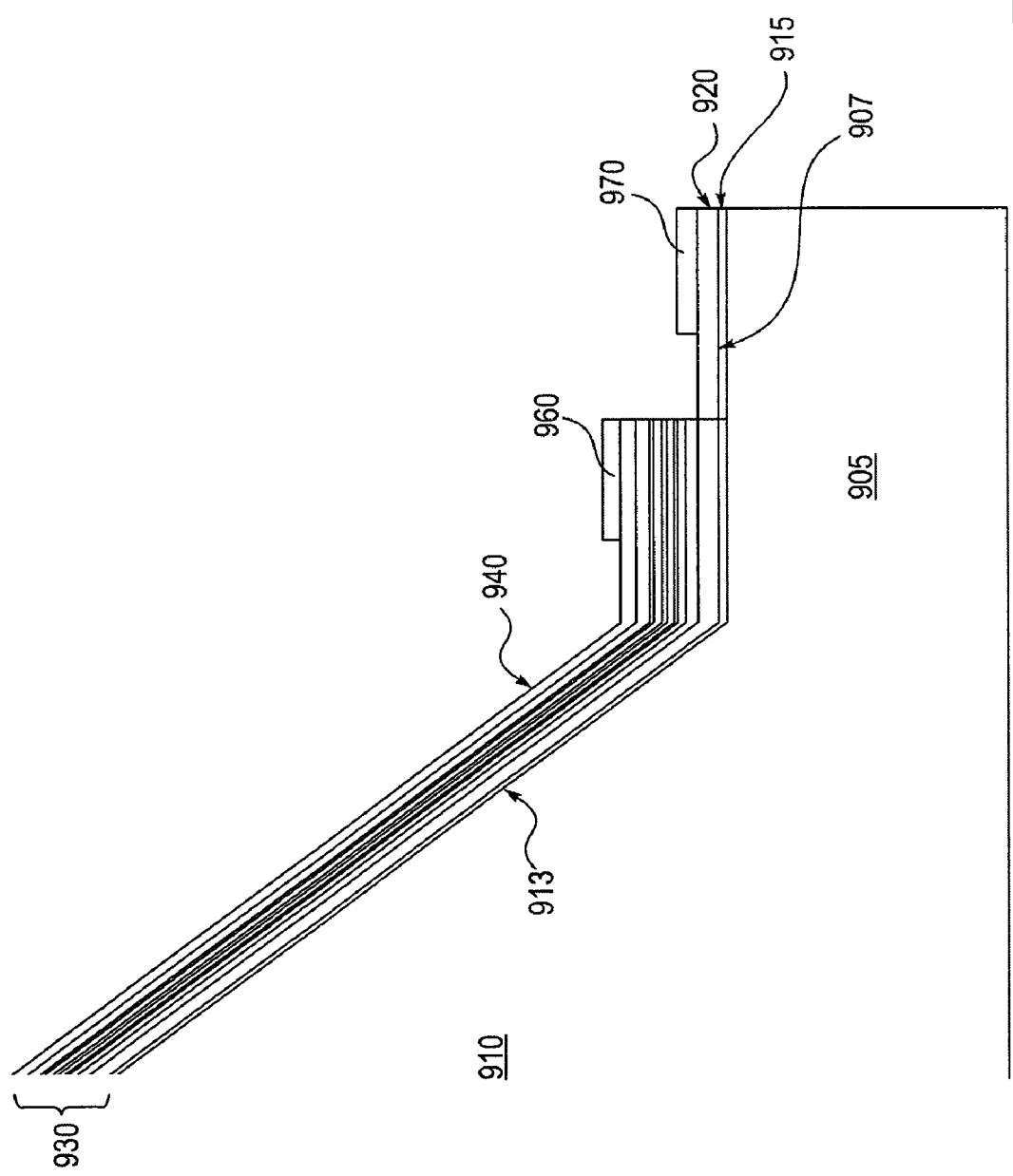
FIG. 10B is a detailed cross-sectional view of a side portion of the light emitting device in FIG. 10A.
Figure 10C:
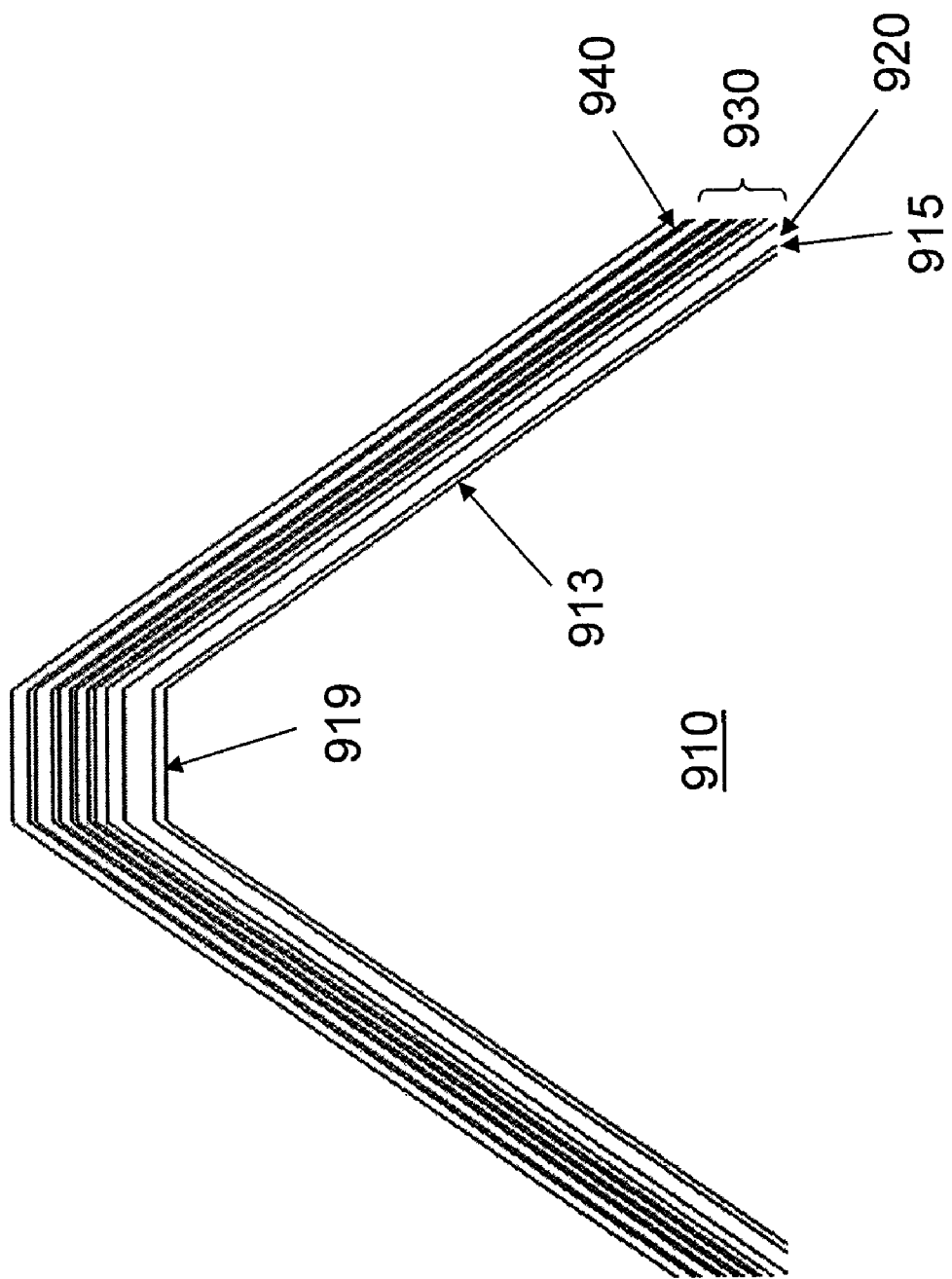
FIG. 10C is a detailed cross-sectional view of the top portion of the light emitting device in FIG. 10A.

An upper Group III-V compound layer 440 is formed on the quantum-well layer 430 (step 850, FIG. 5F). Instead of having the lower Group III-V compound layer 420 n-type doped and the upper Group III-V compound layer 440 p-type doped, the lower Group III-V compound layer 420 can be p-type doped and the upper Group III-V compound layer 440 can be n-type doped (as shown in the flow chart of FIG. 9).

Figure 5G:
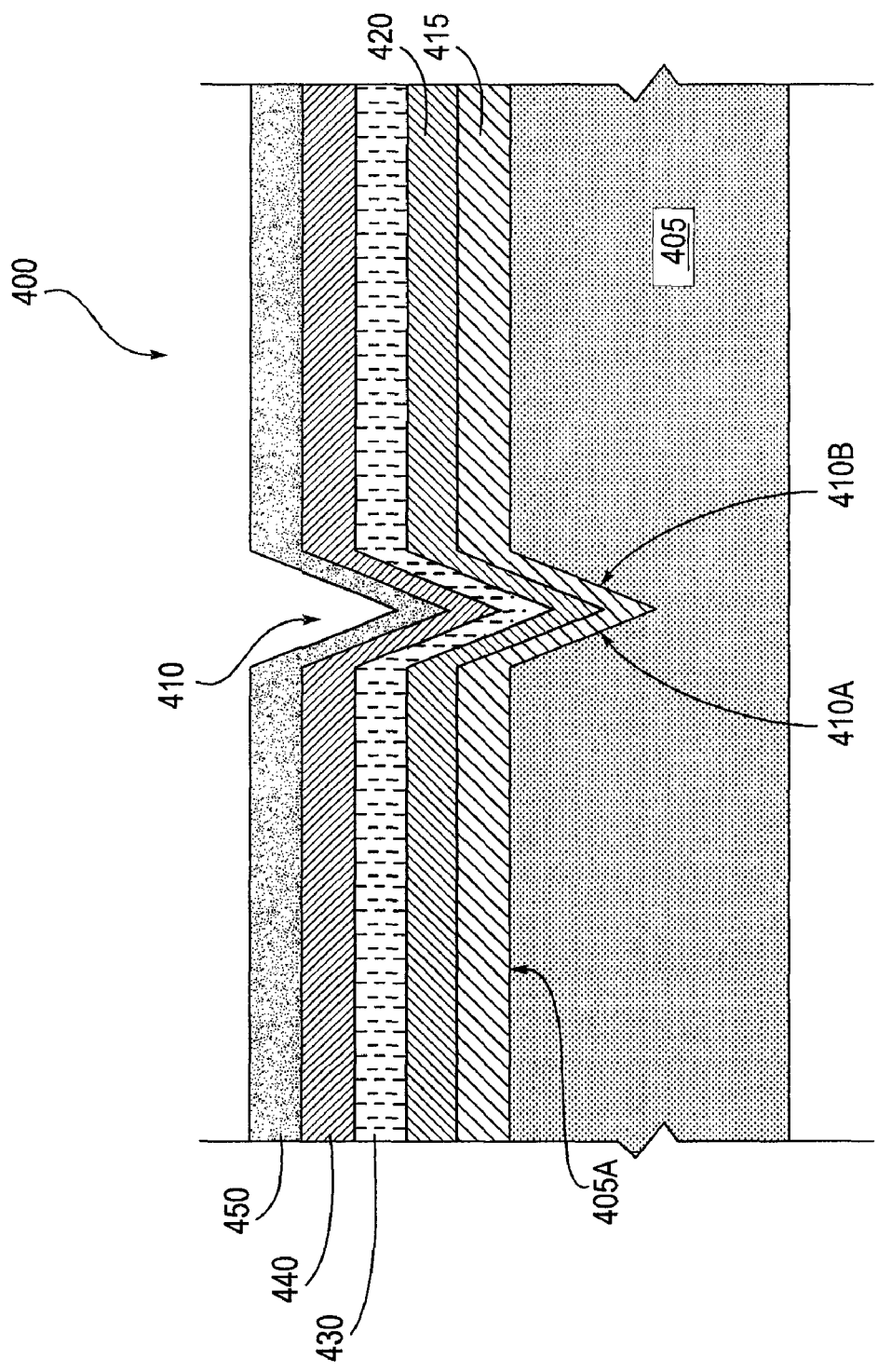

A transparent conductive layer 450 can next be optionally formed on the upper Group III-V compound layer 440 (step 860, FIG. 5G). The formation of the quantum-well layer can include multiple MOCVD steps. For example, each of the multiple steps can include the deposition of a layer 50 Angstroms in thickness.

The quantum-well layer 430, the upper Group III-V compound layer 440, and the conductive layer 450 can also be formed by MOCVD. The MOCVD formations of the lower Group III-V compound layer 420, the quantum-well layer 430, the upper Group III-V compound layer 440, and the conductive layer 450 and the ALD formation of the buffer layers 415 can be formed in a same ALD/CVD chamber system to minimize the number times the substrate's moving in and out of vacuum chambers. The process throughput can be further improved. Impurities during handling an also be reduced.

The quantum-well layer 430, the upper Group III-V compound layer 440, and the conductive layer 450 can next be coated by a photo resist and patterned by photolithography. Portions of the quantum-well layer 430, the upper Group III-V compound layer 440, and the conductive layer 450 can then be removed by wet etching to expose a portion of the upper surface of the lower Group III-V compound layer 420 (step 870, FIG. 5H).

Figure 5H:
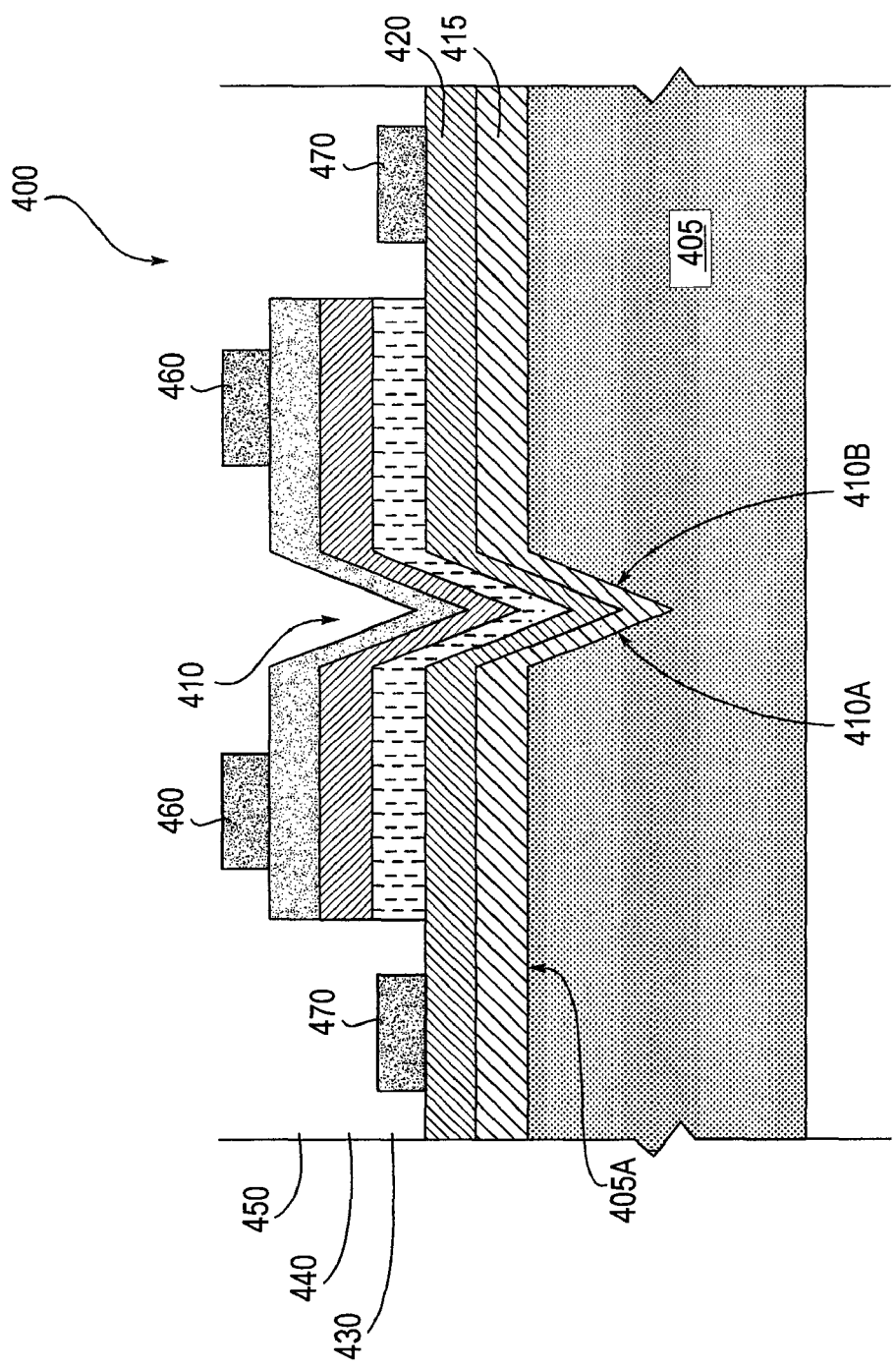

The upper electrode 460 is next formed on the conductive layer 450 (step 880, FIG. 5H). The upper electrode 460 can include Ni/Au bi-layers that have thicknesses of 12 nm and 100 nm respectively. The fabrication of the upper electrode 460 can involve the coating a photo resist layer on the conductive layer 450 and the exposed upper surface of the lower Group III-V compound layer 420. The photo resist layer is then patterned using photolithography and selectively removed to form a mask. Electrode materials are next successively deposited in the openings in the mask. The unwanted electrode materials and the photo resist layer are subsequently removed.

The lower electrode 470 is next formed on the lower Group III-V compound layer 420 (FIG. 5H). The lower electrode 470 can include AuSb/Au bi-layers. The AuSb layer is 18 nm in thickness whereas the Au layer is 100 nm in thickness. The formation of the lower electrode 470 can also be achieved by forming photo resist mask having openings on the lower Group III-V compound layer 420, the depositions of the electrode materials and subsequent removal of the unwanted electrode materials and the photo resist layer. The light emitting device 400 is finally formed.

Figure 5I:
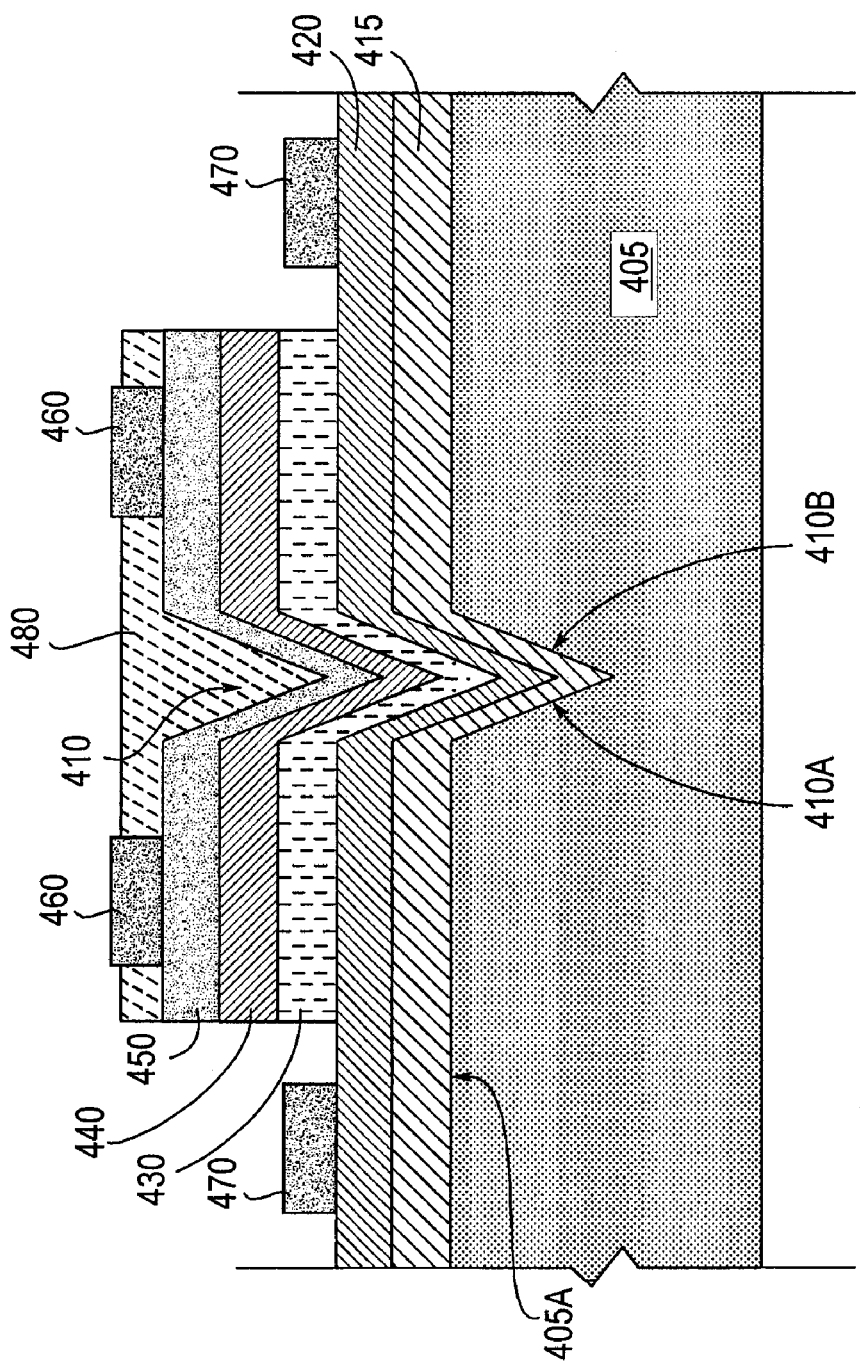

Optionally, referring to FIG. 5I, a protection layer 480 can be introduced over the light emitting device 400 for protecting it from moisture, oxygen, and other harmful substance in the environment. The protection layer 480 can be made of a dielectric material such as silicon oxide, silicon nitride, or epoxy. The protection layer can be patterned to expose the upper electrode 460 and the lower electrode 470 to allow them to receive external electric voltages. In some embodiments, the protection layer can also include thermally conductive materials such as Al and Cu to provide proper cooling the light emitting device 400.

It should be noted that the lower Group III-V compound layer and the upper Group III-V compound layer can have different doping arrangement as long as their doping content are opposite to each other. The lower Group III-V compound layer can be p-type doped and the upper Group III-V compound layer n-type doped. Alternatively, the lower Group III-V compound layer can be n-type doped and the upper Group III-V compound layer p-type doped.

Figure 7:
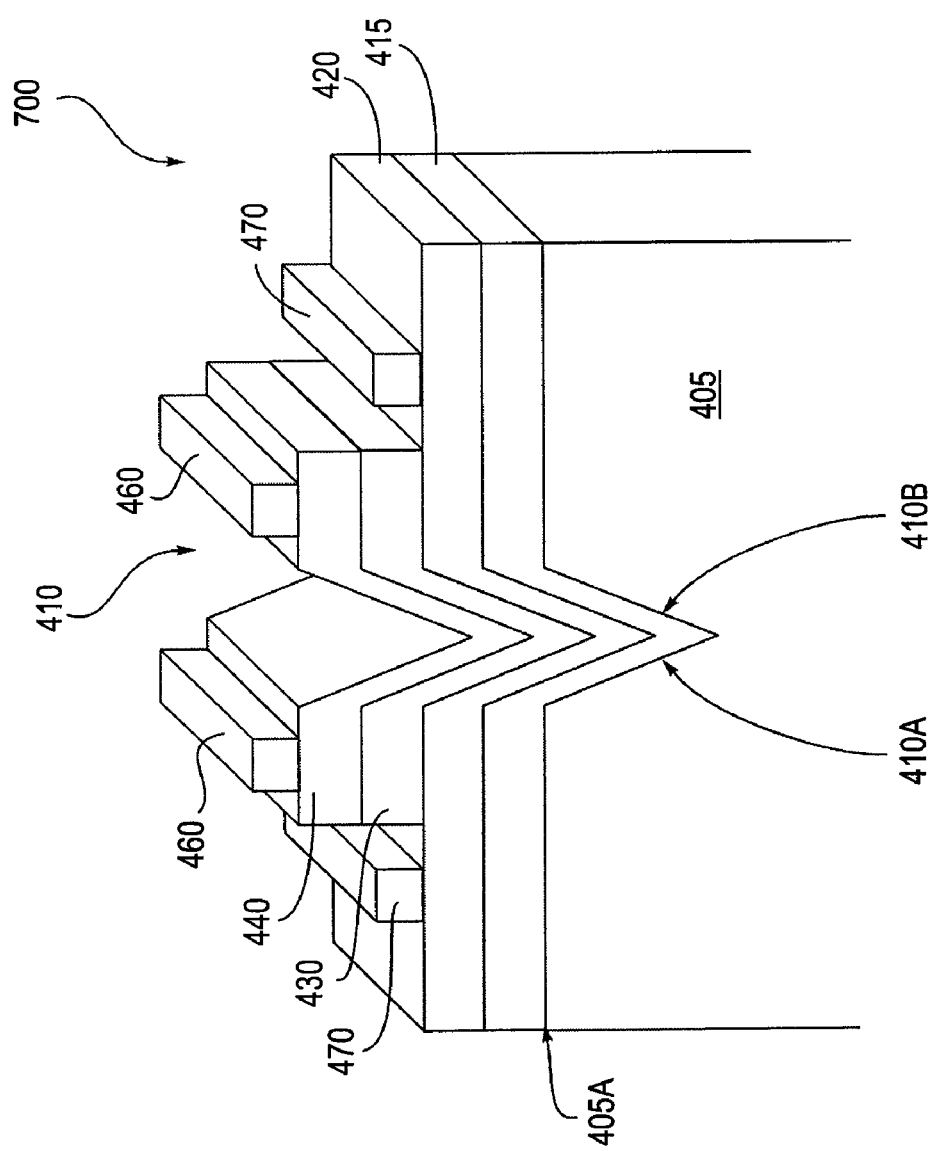
FIG. 7 is a perspective view of another light emitting device in accordance with the present application.
Figure 8:
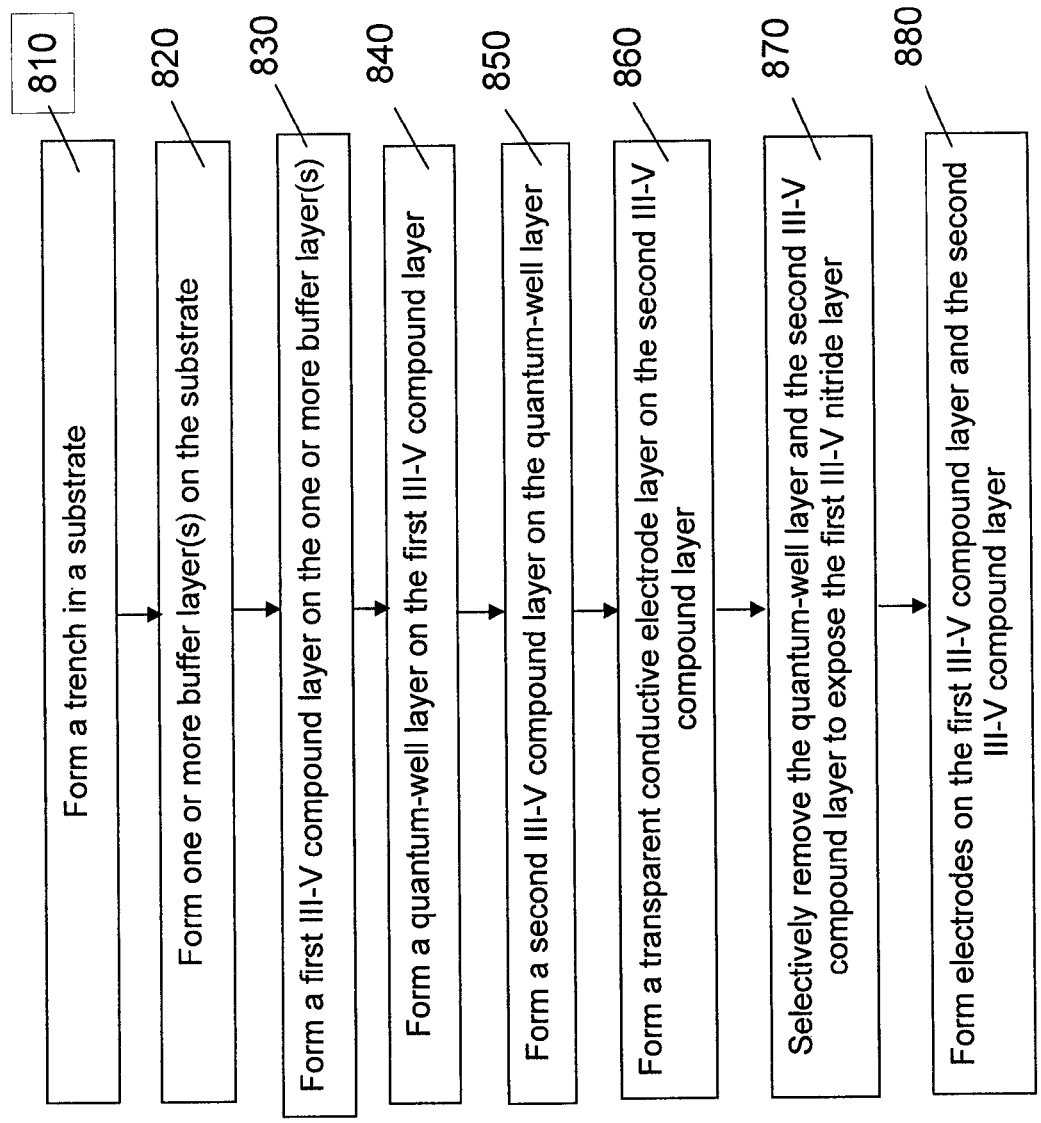
FIG. 8 is a flowchart for a fabricating process for the silicon-based light emitting devices of FIGS. 2-7.

FIG. 7 is a perspective view of another light emitting device 700 in accordance with the present application. Instead of a square opening in the mask layer (FIG. 5A and step 800 below), a rectangle opening is formed in the mask layer 410 to produce an elongated trench after etching. A rectangular opening is sometimes preferred for the long aspect ratio of the trench opening. For example, some light devices require elongated light emission surface(s). For a silicon-based substrate, the upper surface can be parallel to the (100) crystalline plane. The sloped trench surfaces are parallel to the (111) crystalline plane similar to the previous descriptions. The long sloped trench surface can be at least 50% larger in area than the sloped first trench surfaces at the ends of the elongated trench.

The disclosed light emitting devices and fabrication processes can include one or more of the following advantages. The disclosed light emitting devices and fabrication processes can overcome associated with can overcome latter mismatch between the lower Group III-V compound layer and the substrate and prevent associated layer cracking in conventional light emitting devices. The disclosed light emitting devices and fabrication processes can also prevent cracking or delamination in the p-doped or n-doped Group III-V compound layer caused by different thermal expansions between the p-doped Group III-V compound layer and the substrate. An advantage associated with the disclosed light emitting devices is that light emitting devices can significantly increase light emission efficiency by increasing densities of the light emitting devices and by additional light emissions from the sloped or vertical surfaces in the trenches.

The light emission layers in the disclosed light emitting devices can be formed on types of structures other than trenches as described above. Referring to FIGS. 9A to 10C, for example, a light emitting device 900 is formed on a substrate 905 having an upper surface 907. The light emitting device 900 includes a protrusion 910 on the upper surface 907. The protrusion 910 has one or more protrusion surfaces 913 (FIGS. 10A-10C) at a slope relative to the upper surface 907. The protrusion 910 can also have a top surface 919 that is substantially parallel to the upper surface 907. The area of the top surface 919 can be kept smaller than 20% of one of the protrusion surfaces 913. The protrusion 910 can have the shape of a pyramid or a truncated pyramid above the upper surface 907.

The substrate 905 can be silicon based: the upper surface 907 can be parallel to the (100) crystalline plane. The protrusion surface 913 can be parallel to the (111) crystalline surface. (Alternatively, the upper surface 907 can be parallel to the (111) crystalline plane. The protrusion surface 913 can be parallel to the (100) crystalline surface.) The substrate 905 can also include a multi-layer silicon-on-insulator (SOI) structure.

An edge 917 is formed at the intersection of two adjacent protrusion surfaces 913. The substrate 905 can have a rectangular or square shape having an outer edge 908. The light emitting device 900 can be fabricated together with a batch of other light emitting devices on a semiconductor wafer, and diced to form separate dies. The light emitting device 900 can have a rectangular or square die shape defined by a planar area in the plane parallel to the upper surface 907.

The light emitting device 900 includes a reflective buffer layer 915 on the upper surface 907 and the protrusion surfaces 913, a lower Group compound layer 920 on the reflective buffer layer 915, one or more quantum-well layers 930 on the lower Group III-V compound layer 920, and an upper Group III-V compound layer 940. The portion of the upper Group III-V compound layer 940 over the protrusion surface 913 is oriented at an angle relative to the upper surface 907 of the substrate 905. The light emitting device 900 also includes a lower electrode 970 on the lower Group III-V compound layer 920 and an upper electrode 960 on the upper Group III-V compound layer 940.

Figure 11A:
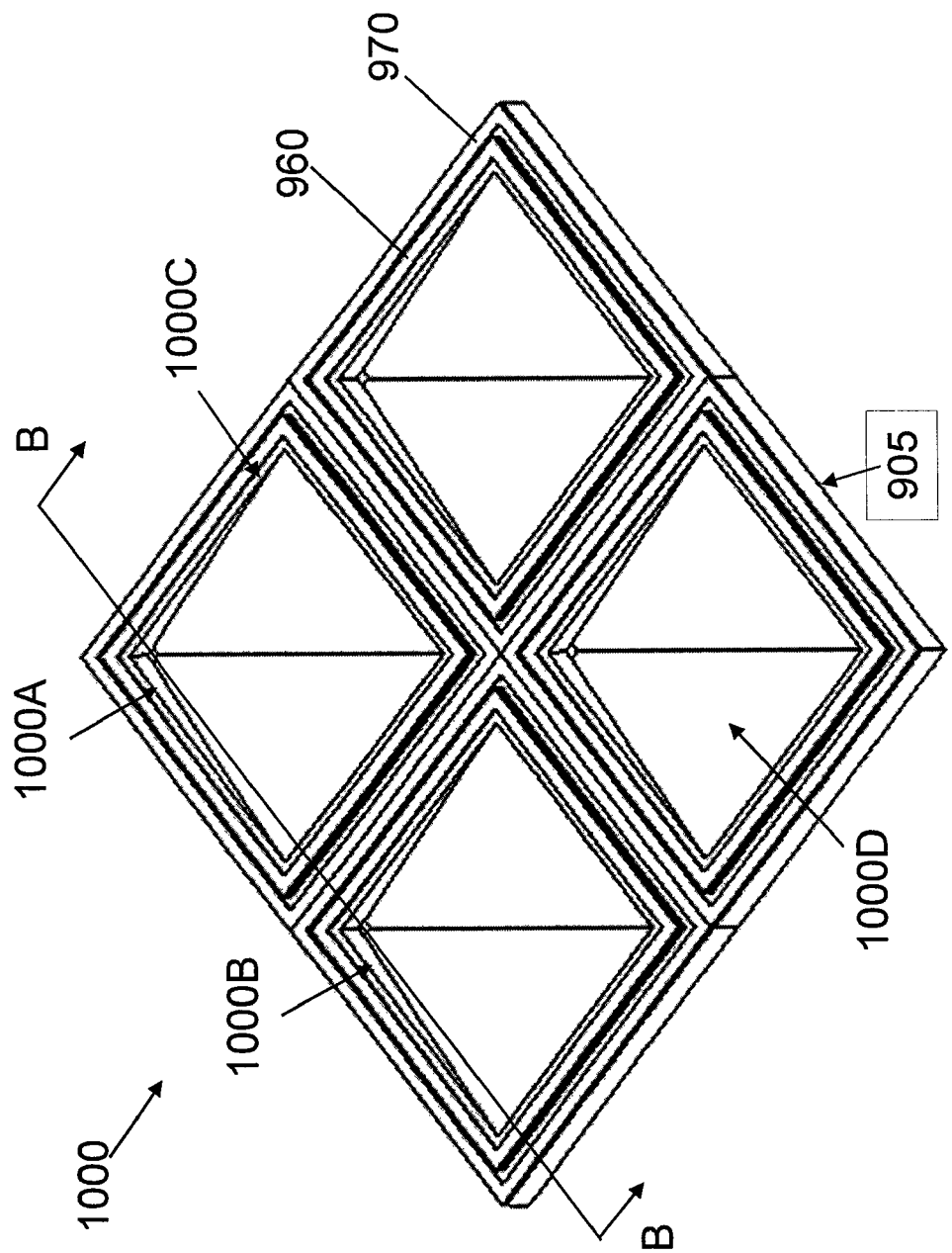
FIG. 11A is a perspective view of a 2×2 array of light emitting structures fabricated on a substrate in accordance with the present application.
Figure 11B:
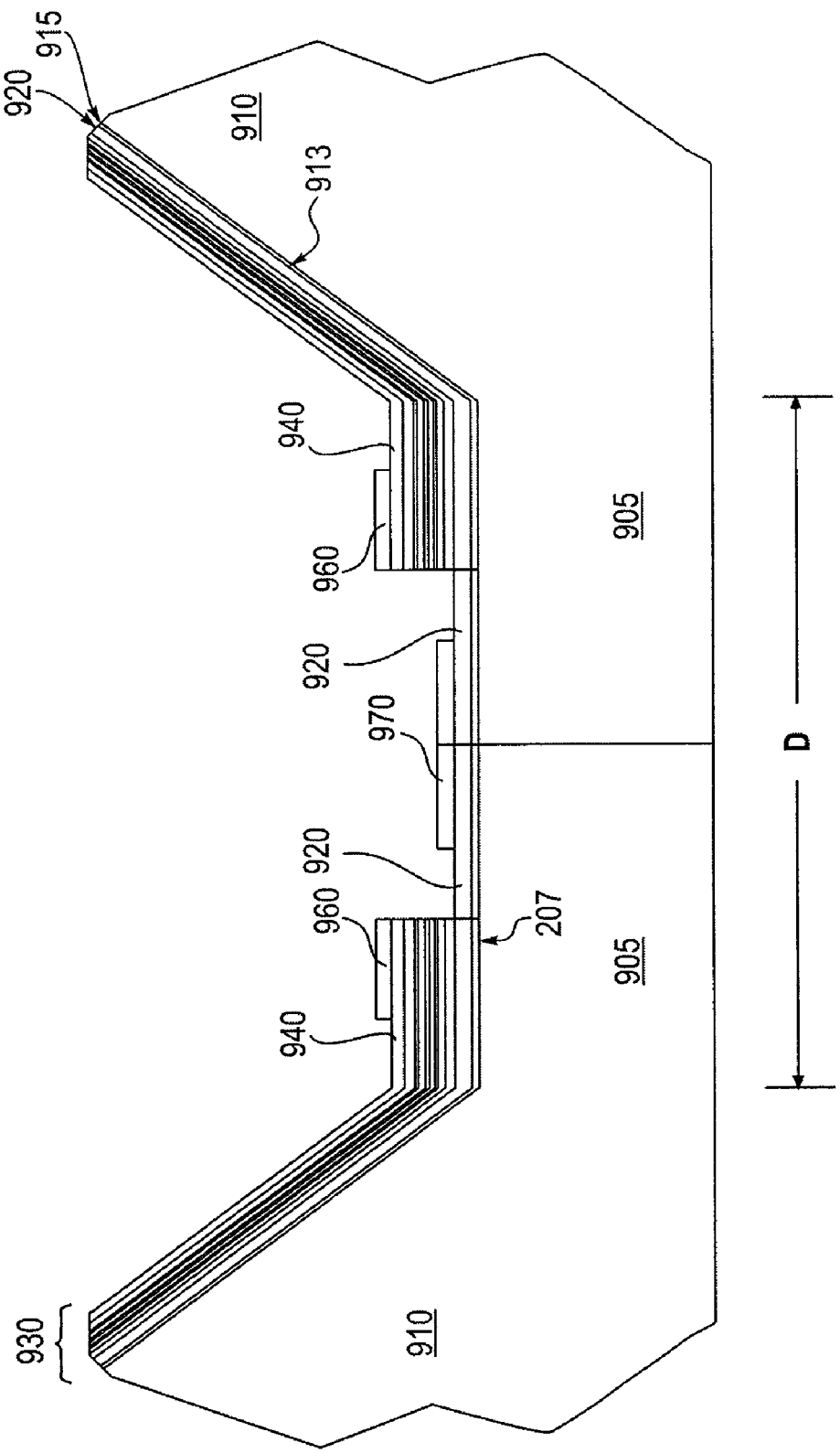
FIG. 11B is a partial cross-sectional view of the light emitting structures along line B-B in FIG. 11A.
Figure 11C:
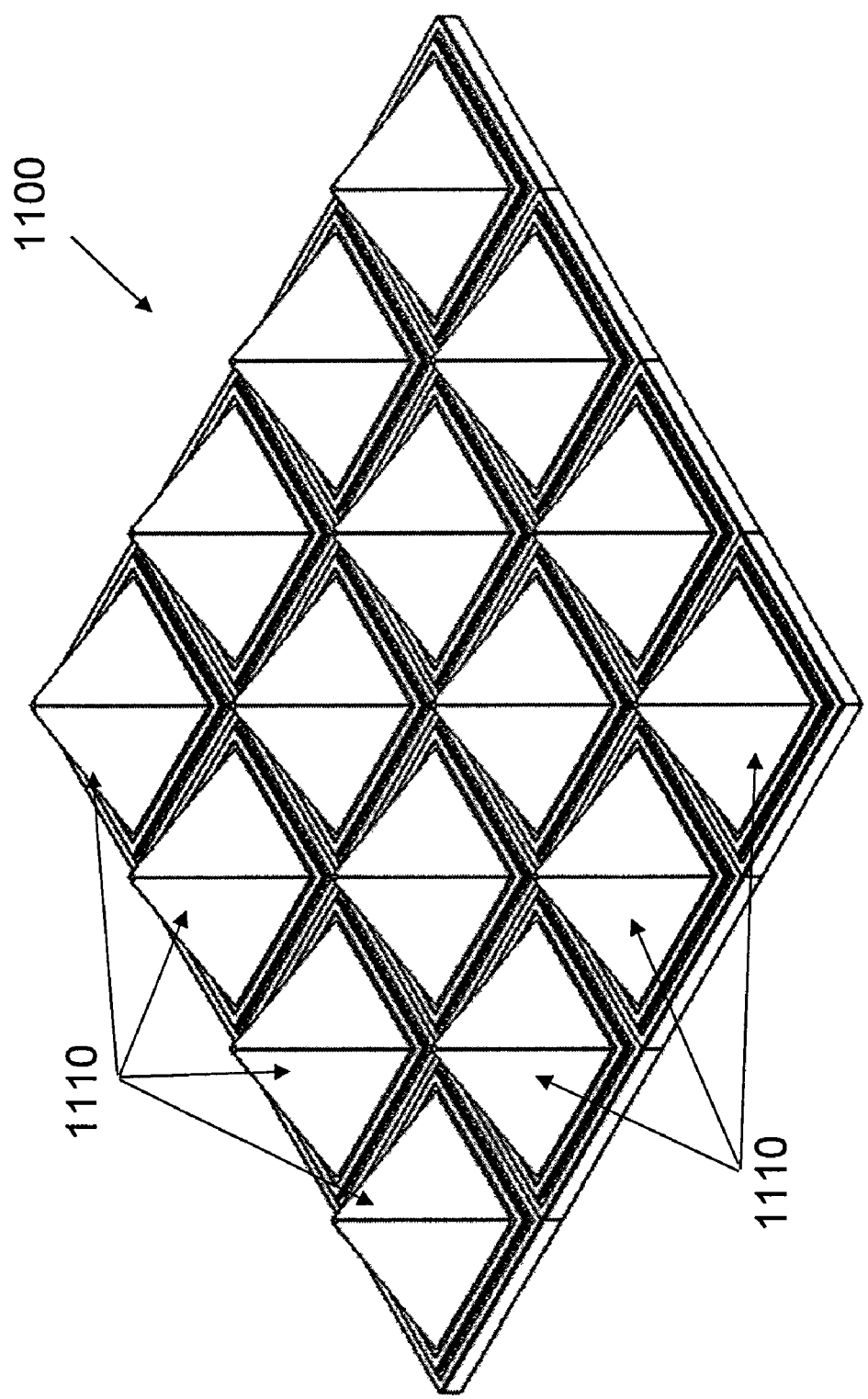
FIG. 11C is a perspective view of a 4×4 array of light emitting structures fabricated on a substrate in accordance with the present application.

In some embodiments, as shown in FIG. 11A, 11B, a semiconductor wafer 1000 includes a 2×2 array of light emitting structures 1000A-1000D formed on a substrate 905. Each of the light emitting structures 1000A-1000D can have a similar structure as that of the light emitting device 900 as described above. The light emitting structures 1000A-1000D can be formed in a 2×2 matrix on a semiconductor wafer. The light emitting structures 1000A-1000D can be used as a single light device, or they can be separated by cutting and dicing to form individual light emitting devices similar to the light emitting device 200. In another example, as shown FIG. 11C, a semiconductor wafer 1100 can include a 4×4 array of light emitting structures 1110.

As described above, the substrate 905 can be silicon based. The upper surface 907 can be parallel to the (100) crystalline plane. The protrusion surface 913 can be parallel to the (111) crystalline surface. The width "D1" of the (100) upper surface 207 (FIG. 11B) can be kept narrow, for example, to be less than 1000 microns, which is much shorter than the width of the wafer substrate for fabricating convention LED light emitting devices. By keeping this dimension small, stress related to differential thermal expansions and lattice mismatch can thus be drastically reduced.

Figure 12:
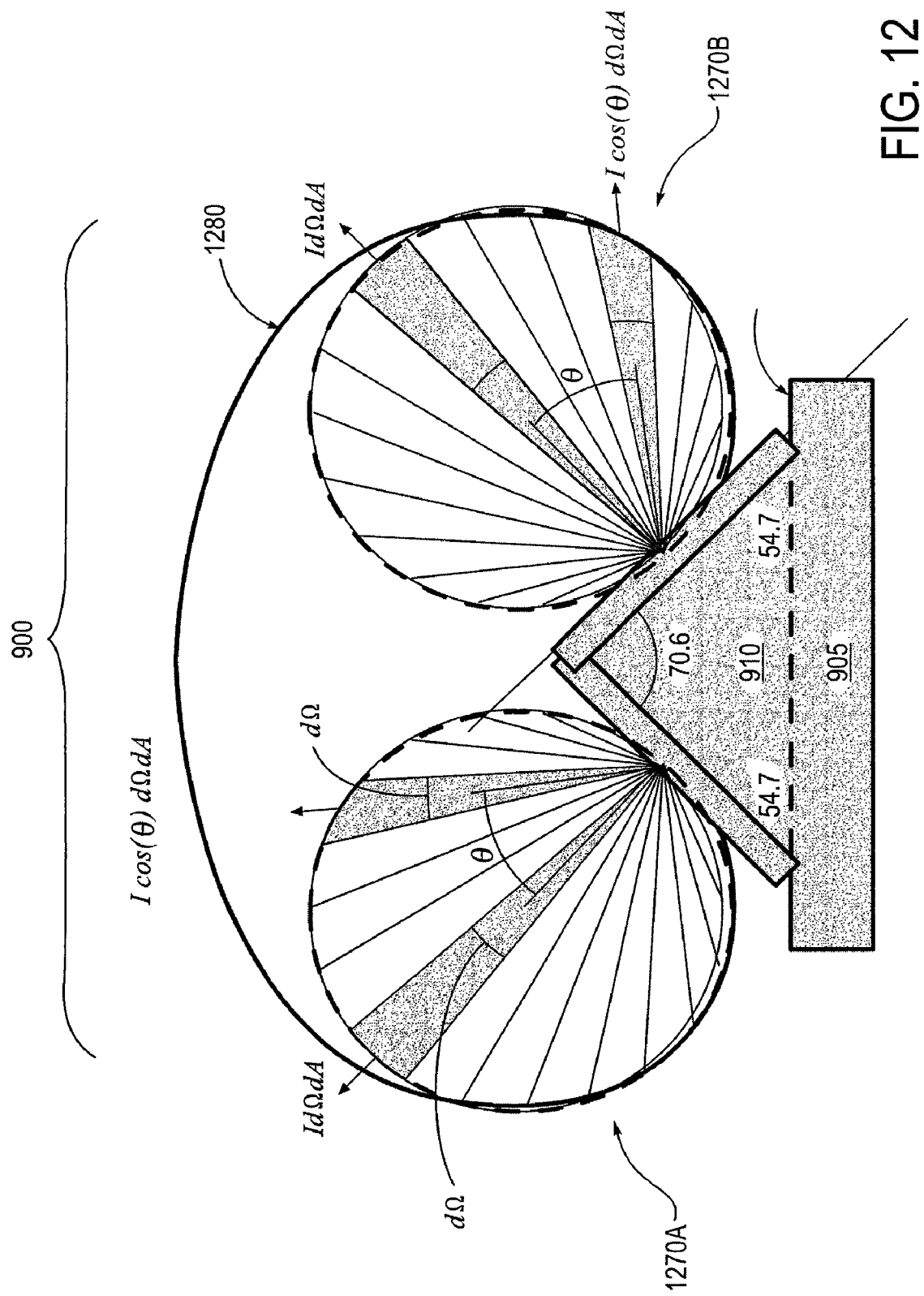
FIG. 12 is a schematic diagram illustrating angular distribution of light emission from the light emitting device illustrated in FIG. 9A.

The light emitting devices shown in FIGS. 9A-11C can produce different angular distribution from conventional LED devices. Referring to FIG. 12, a light emitting device 900 includes a protrusion 910 formed on the substrate 905. Light emitting layers having light emission surfaces 1270A and 1270B are formed on the sloped surfaces of the protrusion 910. For a silicon based substrate, the upper surface 907 can be along the (100) crystalline plane and the sloped light emission surfaces 1270A, 1270B parallel to the (111) crystalline planes. The light emission surfaces 1270A, 1270B are at a 54.7° angle relative to the upper surface 907. For the same foot print on the upper surface, the sum of the areas of the emission surfaces on the light emission surfaces 1270A, 1270B is approximately 1.73 times the area of the flat emission surface 610 in the conventional LED device 600 (FIG. 6A). The disclosed light emitting devices are compatible with other substrate materials and relative orientations of the sloped protrusion surfaces. The sloped protrusion surface can be at an angle between 20 degrees and 80 degrees, or as a more specific example, between 50 degrees and 60 degrees relative to the upper surface of the substrate.

The emission surfaces on a protrusion in the disclosed light emitting device can be more than one time, or 1.2, or 1.4, or 1.6 times of the base area of the protrusion. The large emission surface areas in the described light emitting devices allow the disclosed light emitting device can thus generate much higher light emission intensity than conventional LED devices. The light emission from the light emission surfaces 1270A, 1270B can assume a broad distribution 1280 as shown in FIG. 12.

Embodiments may include one or more of the following advantages. The disclosed light emitting device and related fabrication processes can provide light emitting devices at higher manufacturing throughput and thus manufacturing cost compared to the conventional light emitting devices. The disclosed light emitting device and related fabrication processes can also provide more-integrated light emitting devices that can include, for example, a light emitting element, a driver, power supply, and light modulation unit integrated on a single semiconductor substrate.

The foregoing descriptions and drawings should be considered as illustrative only of the principles of the invention. The invention may be configured in a variety of shapes and sizes and is not limited by the dimensions of the preferred embodiment. Numerous applications of the present invention will readily occur to those skilled in the art. Therefore, it is not desired to limit the invention to the specific examples disclosed or the exact construction and operation shown and described. Rather, all suitable modifications and equivalents may be resorted to, falling within the scope of the invention. For example, the n-doped and the p-doped Group III-V compound layers can be switched in position, that is, the p-doped Group III-V compound layer can be positioned underneath the quantum-well layer and n-doped Group III-V compound layer can be positioned on the quantum-well layer. The disclosed light emitting device may be suitable for emitting green, blue, and emissions of other colored lights.

It should be noted that the disclosed systems and methods are compatible with a wide range of applications such as laser diodes, blue/UV LEDs, Hall-effect sensors, switches, UV detectors, micro electrical mechanical systems (MEMS), and RF power transistors. The disclosed devices may include additional components for various applications. For example, a laser diode based on the disclosed device can include reflective surfaces or mirror surfaces for producing lasing light. For lighting applications, the disclosed system may include additional reflectors and diffusers.

It should also be understood that the presently disclosed light emitting devices are not limited to the trenches and protrusions described above. A substrate can include a first surface having a first orientation and a second surface having a second orientation. The first and the second surfaces may or may not form a trench or a protrusion. A plurality of Group III-V compound layers can be formed on the substrate. The Group III-V compound layers can emit light when an electric current is produced in the Group III-V compound layers.

What is claimed is:

1. A method for fabricating a light emitting device, comprising:
    forming a trench in silicon substrate having a first surface, the trench having more than one trench surface beneath the first surface of the substrate, wherein these trench surfaces are not parallel to the first surface of the substrate, wherein the first surface of the substrate is substantially parallel to the (100) crystal plane of the silicon and the trench surfaces are substantially parallel to the (111) crystal plane of the silicon;
    forming light emission layers over and parallel to the trench surfaces to emit light.

2. The method of claim 1, wherein the trench surfaces are each at an angle between 50 degrees and 60 degrees relative to the first surface of the substrate.

3. The method of claim 1, further comprising forming a trench surface at a bottom of the trench, the bottom trench surface being substantially parallel to the first surface of the substrate.

4. The method of claim 3, wherein the area ratio of the bottom trench surface to the total area of the trench surfaces is less than 50%.

5. The method of claim 1, further comprising forming two additional sloped trench surfaces in the trench in the substrate which also are substantially parallel to the (111) crystal plane of the silicon.

6. The method of claim 5, wherein the trench has an opening in the surface of the substrate with a substantially rectangular shape.

7. The method of claim 1, wherein the trench has an opening in the first surface of the substrate, the opening having a width in the range of 100 microns to 100 mm.

8. The method of claim 1, wherein the light emission layers comprise quantum-well layers configured to emit light when an electric current is produced in the quantum-well layers.

9. The method of claim 1, further comprising forming buffer layers between the sloped trench surfaces and the light emission layers.

10. The method of claim 1, further comprising forming additional trenches in the substrate, each additional trench having: (1) two sloped surfaces beneath the first surface that are not parallel to the first surface, and (2) light emission layers disposed along and parallel to the two sloped surfaces to emit light.

11. The method of claim 10 wherein an angle of between 50 and 60 degrees is formed between the first surface and each of the two sloped surfaces.

12. The method of claim 11 wherein the angle between the first surface and each of the two sloped surfaces is 54.7 degrees.

13. The method of claim 1 wherein an angle of between 50 and 60 degrees is formed between the first surface and each of the two sloped.

14. The method of claim 13 wherein the angle between the first surface and each of the two sloped surfaces is 54.7 degrees.

* * * * *

UNITED STATES PATENT AND TRADEMARK OFFICE
CERTIFICATE OF CORRECTION

PATENT NO. : 8,313,963 B2
APPLICATION NO. : 12/767577
DATED : November 20, 2012
INVENTOR(S) : Shaoher X. Pan Page 1 of 1

It is certified that error appears in the above-identified patent and that said Letters Patent is hereby corrected as shown below:

Title Page;

On page 2, column 1, of the continued listing of [56] References Cited, U.S. Patent Documents, please replace:

"2008/0032409 A1   3/2008   Lee et al."

with

--2008/0032436 A1   2/2008   Lee et al.--

Signed and Sealed this
Sixteenth Day of April, 2013

Teresa Stanek Rea
*Acting Director of the United States Patent and Trademark Office*